(12) United States Patent
Hayashi et al.

(10) Patent No.: US 7,623,101 B2
(45) Date of Patent: Nov. 24, 2009

(54) LIGHT EMITTING DEVICE AND LIGHT EMITTING SYSTEM

(75) Inventors: Kazuhiko Hayashi, Tokyo (JP); Takashi Fukuchi, Tokyo (JP); Shinnzo Tsuboi, Tokyo (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 644 days.

(21) Appl. No.: 11/279,479

(22) Filed: Apr. 12, 2006

(65) Prior Publication Data

US 2006/0192215 A1    Aug. 31, 2006

Related U.S. Application Data

(62) Division of application No. 10/085,607, filed on Feb. 27, 2002, now Pat. No. 7,045,820.

(30) Foreign Application Priority Data

Feb. 27, 2001   (JP)   ............................. 2001-052741

(51) Int. Cl.
*G09G 3/32* (2006.01)
(52) U.S. Cl. .............................. 345/82; 345/77; 257/79
(58) Field of Classification Search ............... 345/44, 345/76, 77, 82; 257/79; 315/169.3
See application file for complete search history.

(56) References Cited

U.S. PATENT DOCUMENTS

| 4,789,888 | A | * | 12/1988 | Miyata et al. ................ 257/435 |
| 4,820,915 | A | | 4/1989 | Hamakawa et al. |
| 5,105,238 | A | | 4/1992 | Nikaido et al. |

(Continued)

FOREIGN PATENT DOCUMENTS

EP    0650955    8/1998

(Continued)

OTHER PUBLICATIONS

The American Heritage Dictionary; www.bartleby.com.

(Continued)

*Primary Examiner*—Chanh Nguyen
*Assistant Examiner*—Kwang-Su Yang
(74) *Attorney, Agent, or Firm*—H.C. Park & Associates, PLC

(57) ABSTRACT

A light emitting device in accordance with the present invention includes a light emitting element and a light sensor for detecting the luminous intensity of the light emitted from the light emitting element. The light emitting element includes a lower electrode, a light emitting material layer including at least a light emitting layer, and an upper electrode having light transparency, which are formed on a substrate in the named order. One of the lower electrode and the upper electrode acts as a cathode, and the other acts as an anode. The light sensor is formed on the light emitting element. Thus, it is possible to provide the light emitting device so configured to sufficiently prevent the unevenness of luminance and the deterioration in color balance, and to efficiently guide the light emitted from the light emitting element to the light sensor, so as to enable to detect the luminous intensity of the emitted light with high sensitiveness, with a minimized adverse mutual influence between the light emitting element and the light sensor.

12 Claims, 16 Drawing Sheets

U.S. PATENT DOCUMENTS

| | | | |
|---|---|---|---|
| 6,133,581 | A | 10/2000 | Terao et al. |
| 6,331,438 | B1 | 12/2001 | Aylott et al. |
| 6,828,951 | B2 * | 12/2004 | Yamazaki et al. ............. 345/77 |
| 2001/0055008 | A1 * | 12/2001 | Young et al. ................ 345/204 |
| 2003/0025136 | A1 | 2/2003 | Zhang et al. |

FOREIGN PATENT DOCUMENTS

| | | |
|---|---|---|
| JP | 5955487 | 3/1984 |
| JP | 61134084 | 6/1986 |
| JP | 62111199 | 7/1987 |
| JP | 62158792 | 10/1987 |
| JP | 63264692 | 11/1988 |
| JP | 63295695 | 12/1988 |
| JP | 02191694 | 7/1990 |
| JP | 03000792 | 1/1991 |
| JP | 03255190 | 11/1991 |
| JP | 04190326 | 7/1992 |
| JP | 04254889 | 9/1992 |
| JP | 05070733 | 3/1993 |
| JP | 05234681 | 9/1993 |
| JP | 05239455 | 9/1993 |
| JP | 05258859 | 10/1993 |
| JP | 05299174 | 11/1993 |
| JP | 06215874 | 8/1994 |
| JP | 07126225 | 5/1995 |
| JP | 07126226 | 5/1995 |
| JP | 08100172 | 4/1996 |
| JP | 2001053260 | 2/2001 |
| JP | 2002-169511 | 8/2002 |

OTHER PUBLICATIONS

"Organic EL elements and the forefront of their industrialization" Published from NTS Publication, pp. 48-49, 69-70, 86-89, 1998.

* cited by examiner

LIGHT EMITTING DEVICE AND LIGHT EMITTING SYSTEM

CROSS-REFERENCE TO RELATED APPLICATIONS

This application is a divisional of prior application Ser. No. 10/085,607, filed Feb. 27, 2002, which claims priority to and the benefit of Japanese Patent Application No. 2001-052741, filed on Feb. 27, 2001, which are all hereby incorporated by reference for all purposes as if fully set forth herein.

BACKGROUND OF THE INVENTION

The present invention relates to a light emitting device and a light emitting system utilizing the same.

In general, a self-luminous light emitting element used in a display device includes a field emission element and an electro-luminescence element (EL element). The EL element can be sorted into an organic EL element having a light emitting layer formed of an organic material and an inorganic EL element having a light emitting layer formed of an inorganic material.

The organic EL element comprises an anode, a cathode, and a very thin organic EL layer sandwiched between two electrodes of the anode and the cathode and formed of an organic light emitting compound. If a voltage is applied between the anode and the cathode, holes and electrons are injected to the organic EL layer from the anode and the cathode, respectively, so that the holes and the electrons are recombined in the organic EL layer. Molecules in the organic light emitting compound constituting the organic EL layer are excited by an energy generated when the holes and the electrons are recombined. In the process in which the molecules thus excited de-excite to a ground state, a light emitting phenomenon occurs. The organic EL element is a light emitting element utilizing this light emitting phenomenon.

The organic EL layer has a single-layer structure or multi-layer structure, which includes an organic layer called a light emitting layer, for emitting light by hole-electron recombination, and at least one of an organic layer called a hole injection layer having the property easy to inject the holes but difficult to transfer the electrons, and another organic layer called an electron injection layer having the property easy to inject the electrons but difficult to transfer the holes.

Recently, the organic EL element is actively researched, and is becoming reduced in practice. This is an element having a fundamental structure which is formed by depositing a hole injection material such as triphenyl diamine (TPD) in the form of a thin film on a transparent electrode (hole injection electrode, namely, anode) such as a tin-doped indium (ITO), further depositing thereon a fluorescent substance such as aluminum quinolinol complex (Alq3) as a light emitting layer, and forming a metal electrode (electron injection electrode, namely, cathode) such as AgMg, having a small work function. With a voltage of about 10V, an extremely high luminance can be obtained on the order of a few hundred to a few ten thousand $cd/m^2$, and therefore, attention is focused onto the organic EL element as electrical equipments and displays in in-home electric goods, automobiles, motorcycles and aircrafts.

The above mentioned organic EL element has a structure in which for example, an organic layer such as a light emitting layer is sandwiched between a scan (common line) electrode functioning as the electron injection electrode and a data (segment line) electrode functioning as the hole injection electrode (transparent electrode), this assembly being formed on a transparent (glass) substrate. The organic EL element constituted as a display, can be divided into a matrix display in which dots are displayed by the scan electrodes and the data electrodes arranged to form a matrix so that information such as an image and characters is displayed by an aggregation of dots (pixels), and a segment display in which display elements having predetermined shapes and sizes are arranged independently of each other.

In the segment display, a static driving method can be adopted which independently drives each display segment. In the matrix display, on the other hand, a dynamic drive method is ordinarily adopted to drive each scan line and each data line in a time division manner.

In a full-color light emitting display using the above mentioned electro-luminescence (EL) element, a problem is encountered in which there occur an unevenness of luminance and a deterioration in a color balance in the display.

The luminance in the organic EL element greatly depends upon each of the layers constituting the organic EL element, particularly, the film thickness of the light emitting layer. Because, the smaller the region in which holes and electrons are recombined is, the larger the luminous efficiency becomes. Therefore, if there is unevenness in the film thickness of the organic layer included in the organic EL element, unevenness occurs in luminance and in color generation. A method for directly forming an organic layer pattern by use of an ink jet is known as a method for forming the organic layer. In this method, however, it is difficult to control the film thickness of each pattern, with the result that luminance unevenness and color generation unevenness are apt to occur.

In addition, in the full-color light emitting display using the organic EL element, the luminance and the color are adjusted by controlling the proportion in light emission of three colors of red, blue and green. This adjusting method includes a method for adjusting the balance in the number of actually light emitting elements of each color and a method for adjusting the balance in the light emitting time of the actually light emitting elements of each color. Here, however, it is a problem that the luminance of the organic EL element changes with the elapse of the light emitting time. In addition, the change with time in the luminance is different from one emitted color to another. Therefore, if a certain time of use has elapsed, the color balance becomes deteriorated.

In order to solve this problem, Japanese Patent Application Pre-examination Publication No. JP-A-59-55487 proposes an electro-luminescence display element (EL display element) in which an organic EL element is associated with a sensor part having an output electricity amount varying dependently upon the luminance of the light emitted from the organic EL element, for the purpose of controlling a drive voltage applied to the organic EL element, so that if the luminance of the organic EL element decreases, the drive voltage level is increased, thereby to substantially maintain the display effect at a constant. As an example of the sensor part capable of detecting the luminance of the light emitted from the element so as to change the drive voltage, FIG. 5 and FIG. 6 of JP-A-59-55487 illustrate an example in which the sensor is located on one plane of a substrate having an opposite plane on which the organic EL element is provided, and FIG. 8 of JP-A-59-55487 illustrates an example in which the sensor is located between the substrate and the organic EL element. In addition, FIGS. 2 to 4 of JP-A-59-55487 illustrate an example in which the sensor part capable of detecting the luminance of the light emitted from the element so as to change the drive voltage, is located at a side of the organic EL element.

However, in the case that the sensor part is provided under the organic EL element, it become necessary to form the organic EL element after the sensor part is formed, so that the characteristics of the sensor part is in some cases deteriorated for the influence of the process for forming the organic EL element, or the surface condition of the underlying layer on which the organic EL element is to be formed becomes concavo-convex because of existence of the sensor part, with the result that the characteristics of the organic EL element formed on such an underlying layer is deteriorated in some cases. On the other hand, in the case that the sensor part is located at the side of the organic EL element, since the light emitted from the organic EL element is not effectively inputted on the sensor part, it is difficult to sensitively detect the strength of the light emitted from the organic EL element.

In the case that the sensor part is located on one plane of a substrate having an opposite plane on which the organic EL element is provided, since the organic EL element is divided into a substrate surface light emitting type configured to emit the light through the substrate and a film surface light emitting type configured to emit the light through no intermediary of the substrate, this structure can applied to the former type because this structure needs to locate the substrate between the light emitting element and the sensor part. In addition, when the substrate is located between the light emitting element and the sensor part, it becomes necessary to turn the substrate in the way of the manufacturing process, and therefore, the manufacturing process becomes complicated. Furthermore, since the light emitting element and the sensor are provided on opposite surfaces of the substrate, respectively, the alignment between the light emitting element and the sensor becomes difficult. Specifically, it is necessary to previously provide alignment marks of element patterning on the opposite surfaces of the substrate, respectively, and it is difficult to precisely align the light emitting element and the sensor with each other, because of the thickness of the substrate. The smaller the size of the light emitting element is, the more the required alignment becomes precise, and therefore, it becomes important to elevate the required alignment.

Furthermore, Japanese Patent Application Pre-examination Publication No. JP-A-04-190326 discloses a liquid crystal display with a back light in which a device (phototransistor) for detecting the luminance of the EL element is located at a position irradiated with a portion of the light emitted from the EL element when the EL element is energized, specifically, at a position slightly deviated from a position between the EL element and a liquid crystal display part (FIG. 1). Also in this case, however, since the light emitted from the EL element is not effectively inputted on the phototransistor, it is difficult to sensitively detect the luminance of the EL element. In addition, since this system is such that the amount of the light emitted from the EL element is detected by one phototransistor so that the luminance of the total of the EL elements is controlled by the result of the detection, this system can elongate the service life of the EL light emitting device, but cannot minimize the unevenness in luminance and the deterioration in the color balance.

Japanese Utility Model Application Pre-examination Publication No. JU-A-62-158792 discloses an EL light emitting device in which a photodiode of a luminance compensating circuit is located at an end of a light emitting part. In this example, however, since the light emitted from the EL element is not efficiently inputted to the photodiode, it is difficult to sensitively detect the luminance of the EL element. In addition, since this system is such that the amount of the light emitted from the EL element is detected by one photodiode so that the luminance of the total of the EL elements is controlled by the result of the detection, this system can elongate the service life of the EL light emitting device, but cannot minimize the unevenness in luminance and the deterioration in the color balance.

Japanese Utility Model Application Pre-examination Publication No. JU-A-62-111199 and Japanese Patent Application Pre-examination Publication No. JP-A-04-254889 disclose an EL display device in which, in addition to pixels, a reference pixel (detecting electro-luminescence element) is provided at a position out of a display region, and the strength of the light emitted from the reference pixel is detected. In order to prevent the unevenness in luminance and the deterioration in the color balance by the reference pixel, it is necessary to actually form many reference pixels, and this is disadvantageous in view of productivity and others. In addition, it is possible to more effectively prevent the unevenness in luminance and the deterioration in the color balance by optimizing the amount of emitted light on the basis of the luminance of the light emitted from the light emitting element itself, rather than by optimizing the amount of emitted light or the light emitting time on the basis of the luminance of the light emitted from the reference pixel.

BRIEF SUMMARY OF THE INVENTION

Accordingly, it is an object of the present invention to provide a light emitting device capable of sufficiently minimizing the unevenness in luminance and the deterioration in the color balance, and capable of effectively guiding the light emitted from a light emitting element to a light sensor so as to sensitively detect the strength of the light emitted from the element, with a minimized adverse mutual influence between the light emitting element and the light sensor, and a light emitting system utilizing the light emitting device.

The above mentioned object can be achieved by the present invention as follows:

(1) A light emitting device including a light emitting element and a light sensor for detecting the luminous intensity of the light emitted from the light emitting element, the light emitting element including a lower electrode, a light emitting material layer including at least a light emitting layer, and an upper electrode having light transparency, which are formed on a substrate in the named order, one of the lower electrode and the upper electrode acting as a cathode, and the other acting as an anode, the light sensor being formed on the light emitting element.

(2) A light emitting device mentioned in the above Item (1), wherein the light sensor is formed on the upper electrode.

(3) A light emitting device mentioned in the above Item (1) or (2), wherein light emitting element is an electro-luminescence element, (4) A light emitting device mentioned in the above Item (3), wherein the electro-luminescence element includes an organic thin film as the light emitting layer included in the light emitting material layer, the organic thin film has a structure emitting the light in response to an applied current.

(5) A light emitting device mentioned in the above Item (4), wherein a hole injection and transport layer is provided between the light emitting layer and the other of the lower electrode and the upper electrode acting as the anode.

(6) A light emitting device mentioned in the above Item (4) or (5), wherein an electron injection and transport layer is provided between the light emitting layer and the one of the lower electrode and the upper electrode acting as the cathode.

(7) A light emitting device mentioned in any of the above Items (1) to (6), wherein the light sensor includes a pn junction formed by a region formed of a p-type semiconductor and another region formed of an n-type semiconductor.

(8) A light emitting device mentioned in any of the above Items (1) to (6), wherein the light sensor includes a pin structure formed by a region formed of a p-type semiconductors another region formed of an n-type semiconductor, and an intrinsic semiconductor sandwiched between those two regions.

(9) A light emitting system comprising:
a light emitting device mentioned in any of the above Items (1) to (8), the light sensor included in the light emitting device outputting the detection result of the luminous intensity as a current signal,
a light sensor switching element for switching whether or not a biasing voltage is applied which enables to generate the current signal in proportion to the amount of the light received, the light sensor switching element being provided in the way of a bias voltage supplying line for the light sensor,
a light sensor switching unit for controlling a switching operation of the light sensor switching element, the light sensor switching element being connected to the light sensor switching unit through a light sensor switching line.

(10) A light emitting system mentioned in the above Item (9) including a plurality of light emitting devices,
wherein said light sensor switching line is located in the form of a matrix having rows and columns,
wherein each light sensor switching element is connected to one light sensor switching line of a column direction and to one light sensor switching line of a row direction
wherein the light sensor switching lines of the column direction and the row direction are connected to the light sensor switching unit, which applies a voltage to a selected column direction light sensor switching line and a selected row direction light sensor switching line so that the biasing voltage is applied to the specific light sensor connected to the light sensor switching element connected to the selected column direction light sensor switching line and the selected row direction light sensor switching line, whereby the current signal generated by the specific light sensor is detected.

(11) A light emitting system mentioned in the above Item (9) or (10) further including a luminous intensity detecting unit connected to the light sensor for detecting, as luminous intensity information of the light emitted from the light emitting element, the current signal generated in response to a reception by the light sensor, of a portion of the light emitted from the light emitting element, or a voltage signal generated from the current signal.

(12) A light emitting system mentioned in any of the above Items (9) to (11) further including a current applying element connected to the light emitting element, for supplying the light emitting element with an electric current used in order to cause the light emitting element to emit the light 13) A light emitting system mentioned in the above Item (12), wherein the current applying element is constituted of a thin film transistor having a gate, a drain and a source, and
wherein the electric current is supplied to the light emitting element by connecting the lower electrode or the upper electrode of the light emitting element to the drain or the source of the thin film transistor.

(14) A light emitting system mentioned in the above Item (12) or (13), further including a current application switching element for switching whether or not the electric current is supplied from the current applying element to the light emitting element.

(15) A light emitting system mentioned in the above Item (14), wherein the current application switching element includes at least one FET transistor, and
wherein the current applying element is constituted of a thin film transistor having a gate, a drain and a source, the drain of the FET transistor included in the current application switching element being connected to the gate of the transistor included in the current applying element,
so that the application of the electric current by the current applying element is switched by an ON-OFF operation of the FET transistor included in the current application switching element.

(16) A light emitting system mentioned in any of the above Items (12) to (15), further including a light emission amount adjusting unit for obtaining an optimum value of the electric current supplied to the light emitting element on the basis of the luminous intensity information of the light emitted from the light emitting element and detected by the luminous intensity detecting unit, the light emission amount adjusting unit adjusting the electric current supplied from the current applying element to the light emitting element, to the optimum value of the electric current.

(17) A light emitting system mentioned in any of the above Items (14) to (16), including a plurality of light emitting devices, and a current application switching unit for controlling the switching operation of the current application switching element which switches whether or not the electric current is supplied from the current applying element to the light emitting element.
wherein the switching line is located in the form of a matrix having rows and columns,
wherein each current application switching element is connected to one light sensor switching line of a column direction and to one light sensor switching line of a row direction
wherein the light sensor switching lines of the column direction and the row direction are connected to the current application switching unit, which applies a voltage to a selected column direction switching line and a selected row direction switching line so that an electric current is supplied from a specific current applying element connected to a specific current application switching element connected to the selected column direction switching line and the selected row direction switching line, whereby the current is supplied to the specific light emitting element connected to the specific current applying element.

(18) A light emitting system mentioned in the above Item (17), including a light emission time adjusting unit for obtaining an optimum time of the electric current supplied to the light emitting element on the basis of the luminous intensity information of the light emitted from the light emitting element and detected by the luminous intensity detecting unit, the light emission time adjusting unit controlling the switching operation of the current application switching element by the current application switching unit, whereby adjusting the time of the electric current supplied from the current applying element to the light emitting element, to the optimum time of the electric current.

(19) A light emitting system mentioned in any of the above Items (9) to (18), wherein the light sensor includes a pn junction formed by a region formed of a p-type semiconductor and another region formed of an n-type semiconductor, or a pin structure formed by a region formed of a p-type semiconductor, another region formed of an n-type semiconductor, and an intrinsic semiconductor sandwiched between those two regions.

wherein the light sensor switching element includes at least one FET transistor, a drain of the one FET transistor included in the light sensor switching element being connected to the n-type semiconductor of the light sensor, the light sensor switching element is switched by an ON-OFF operation of the FET transistor having the drain connected to the n-type semiconductor of the light sensor.

(20) A light emitting system mentioned in the above Item (19), wherein the FET transistor having the drain connected to the n-type semiconductor of the light sensor has a source connected to the luminous intensity detecting unit through a light sensor current detecting line, so that the current signal generated in response to a reception by the light sensor, of a portion of the light emitted from the light emitting element, flows as a source-drain current of the FET transistor having the drain connected to the n-type semiconductor of the light sensor, and is transmitted to the luminous intensity detecting unit through the light sensor current detecting line.

The light emitting device in accordance with the present invention is such that the light sensor for detecting the luminous intensity of the light emitted from the light emitting element is formed on the light emitting element. The light emitting element is of the structure including the lower electrode, the light emitting material layer including at least the light emitting layer, and the upper electrode having light transparency, which are formed on the substrate in the named order. One of the lower electrode and the upper electrode acts as a cathode, and the other acts as an anode. Ordinarily, however, the lower electrode constitutes the cathode, and the upper electrode constitutes the anode.

The light emitting element has a mechanism generating the light in response to the electric current. By applying a voltage between the lower electrode and the upper electrode, which function as the cathode and the anode, the electric current is caused to flow through the light emitting material layer including at least the light emitting layer, so that the light is generated in the light emitting layer by the electric current.

The light sensor receives the portion of the light emitted from the light emitting element, and generates the current signal in proportion to the amount of the light received. In order to receive, of the light emitted from the light emitting element, a light portion emitted in a direction towards the upper electrode, namely, in the direction opposite to the direction towards the substrate, the light sensor is located on the light emitting element. Therefore, since the light sensor receives through the upper electrode the light emitted from the light emitting element, the upper electrode must be transparent to the light emitted from the light emitting element.

The light sensor can be exemplified by the type having a pn junction formed by a region formed of a p-type semiconductor and another region formed of an n-type semiconductor and utilizing a mechanism of generating the current signal in proportion to the amount of the light received by action of the pn junction, or the type having a pin structure formed by a region formed of a p-type semiconductor, another region formed of an n-type semiconductor, and an intrinsic semiconductor sandwiched between those two regions and utilizing a mechanism of generating the current signal in proportion to the amount of the light received by action of the pin structure.

The light emitting device in accordance with the present invention detects the luminous intensity of the light emitted from the light emitting element, by action of the light sensor, and optimizes, on the basis of the luminous intensity information obtained, the light emission amount (the current caused to flow through the light emitting element) and/or the light emitting time of each light emitting element, whereby it is possible to sufficiently prevent the unevenness of luminance and the deterioration in color balance. In addition, since the light sensor is formed on the light emitting element, the light emitted from the light emitting element can be efficiently guided to the light sensor, so that it is possible to detect the luminous intensity of the emitted light with high sensitiveness. In addition, adverse mutual influence between the light emitting element and the light sensor can be minimized. Particularly, the advantage of the present invention is remarkable in the case that the organic EL element is used as the light emitting element.

DETAILED DESCRIPTION OF THE INVENTION

Now, embodiments of the present invention will be described with reference to the drawings.

Figure 1:
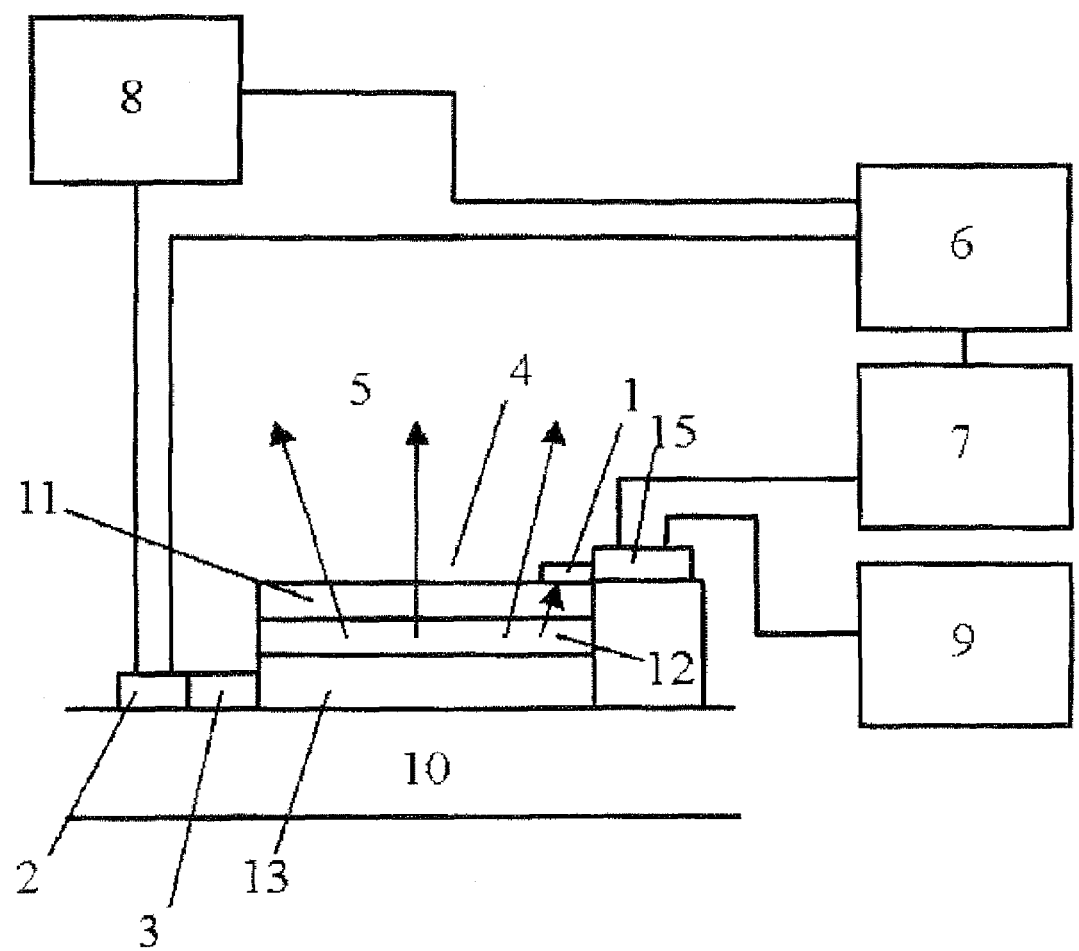
FIG. 1 is a structure view illustrating the light emitting system in accordance with the present invention.

FIG. 1 is a structure view illustrating the light emitting system in accordance with the present invention.

In the shown structure, a lower electrode 13 is formed on a substrate 10, and a light emitting material layer 12 is formed on the lower electrode 13, and further, an upper electrode 11 is formed on the light emitting material layer 12, so that a light emitting element 4 is constituted. In addition, a light sensor 1 is provided on the light emitting element 4.

A current applying element 3 for applying a drive current to the light emitting element 4 so as to cause the light emitting element to generate light, is formed adjacent to the light emitting element 4 and is connected to the light emitting element 4. Furthermore, a current application switching element 2 for switching whether or not the current applying element 3 actually supplies the current to the light emitting element 4, is formed adjacent to the current applying element 3 and is connected to the current applying element 3.

The light emitting element 4 emits the light in an upper direction in the drawing, and a portion of the light thus emitted is inputted to the light sensor 1.

The light sensor 1 is connected to a light sensor switching element 15 for switching whether or not luminous intensity information supplied in the form of a current or a voltage from the light sensor should be picked up. Whether or not the luminous intensity information should be picked up by the light sensor switching element 15, is controlled by a light sensor switching unit 9 which is connected to the light sensor switching element 15. Furthermore, the light sensor switching element 15 is connected to a luminous intensity detecting unit 7, which detects the luminous intensity information supplied from the light sensor 1. The luminous intensity information includes a luminous intensity and a light emitting time.

The detected luminous intensity information is supplied to a light emission amount adjusting unit and light emission time adjusting unit 6, where the condition for giving an optimum light emission amount is calculated. The optimum condition is set to be nearest to an originally set predetermined value. Specifically, the light emission amount (the value of the current caused to flow through the light emitting element) and the light emission time are optimized to approach to a viewing impression (color balance and luminance balance) in the light emitting device in an original condition to a possible extent. Furthermore, the light emission time adjusting unit 6 drives the current application switching element 2 through a current application switching unit 8 to control the current applying element 3 to cause an electric current to flow through the light emitting element 4 on the basis of an optimum light emitting time thus obtained. The value of the current caused to flow through the light emitting element 4 is instructed to the current applying element 3 by means of the light emission time adjusting unit 6. Thus, the luminous intensity information of the light emitted from the light emitting element under a new condition is detected by the light sensor 1, and is fed back to obtain a next light emission amount and light emission time.

Figure 2:
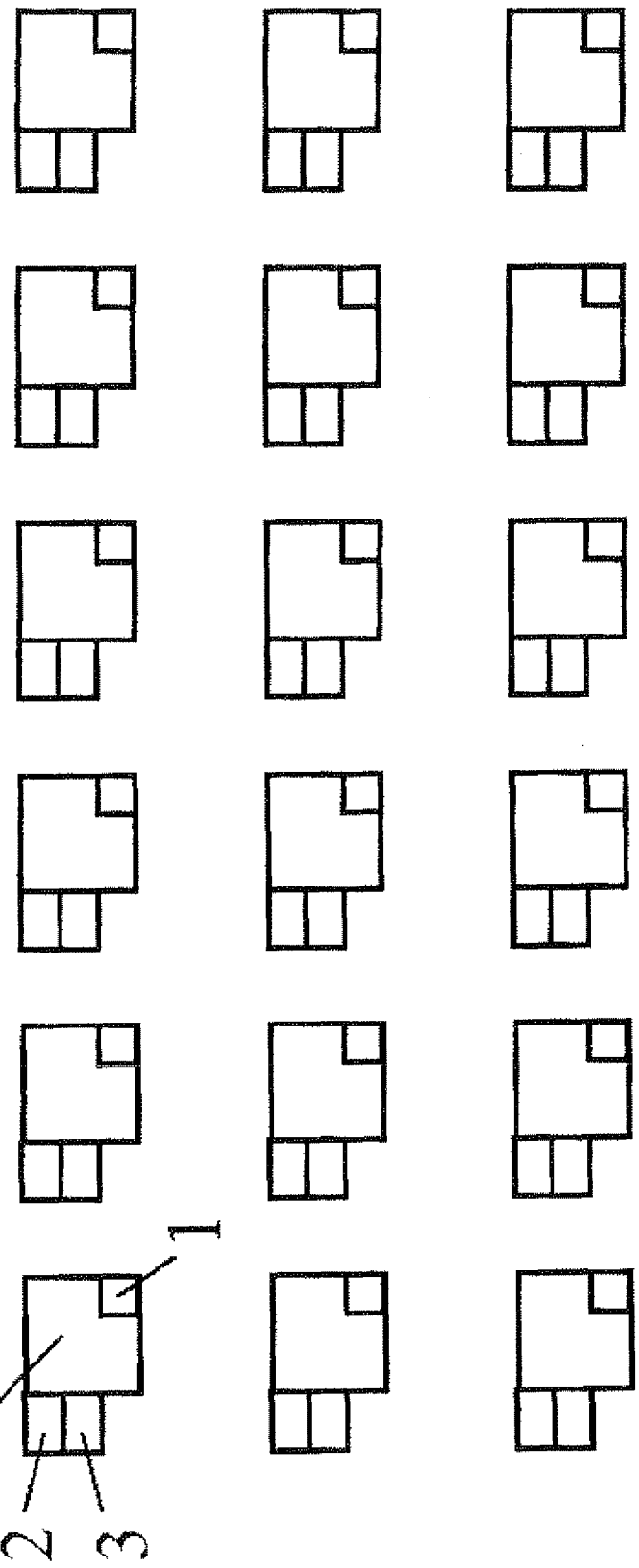
FIG. 2 is a plan view illustrating a location diagram of light emitting devices in accordance with the present invention.

A light emitting device is formed by arranging light emitting elements, each of which has the same structure as the single element shown in FIG. 1, to form an array as shown in the plan view of FIG. 2 for example. The shown example includes three rows and six columns of elements, but the number of the rows and the number of columns can be suitably selected.

In addition, it is sufficient if the light sensor is provided on the light emitting device, and the shape and the size of the light sensor can be suitably selected without restriction.

Figure 3:
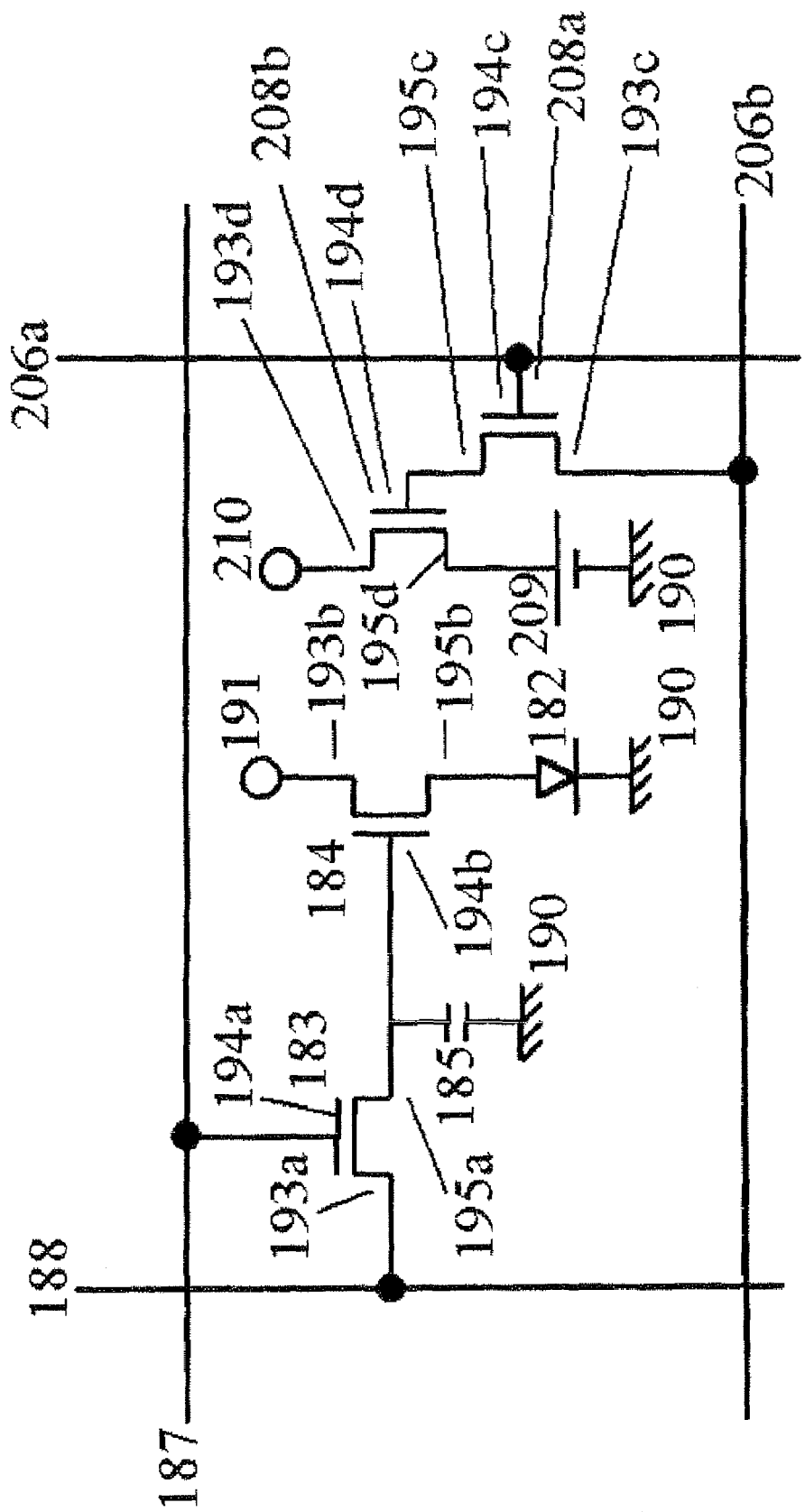
FIG. 3 is a circuit diagram illustrating the light emitting system in accordance with the present invention.

FIG. 3 is a circuit diagram illustrating a peripheral circuit of the light emitting device in accordance with the present invention.

A gate 194a of a switching transistor 183 is connected to a first switching line 187, and a source 193a of the switching transistor 183 is connected to a second switching line 188. A drain of the switching transistor 183 is connected to one end of a voltage holding capacitor 185 having the other end connected to ground 190, and to a gate 194b of a current applying transistor 184. The voltage holding capacitor 185 can be omitted in some case. A source 193b of the current applying transistor 184 is connected to a current source 191, and a drain of the current applying transistor 184 is connected to an anode of a light emitting element 182. A cathode of the light emitting element 182 is connected to the ground 190. An anode of a light sensor 209 is connected to the ground and a cathode of the light sensor 209 is connected to a drain 195d of a second switching transistor 208b for a light sensor switching. A gate 194d of the second switching transistor 208b for the light sensor switching is connected to a drain 195c of a first switching transistor 208a for a light sensor switching. A voltage holding capacitor can be connected between the drain 195c and the ground 190 in some case. Furthermore, a gate 194c of the first switching transistor for the light sensor switching is connected to a first line 206a for a light sensor switching, and a source of the first switching transistor for the light sensor switching is connected to a second line 206b for a light sensor switching. In the shown example, the end of the voltage holding capacitor 185 and the end of the light sensor 209 are connected to the ground 190, but can be connected to any point if it has a constant voltage, and therefore, can be connected to the current source 191.

In the structure shown in the circuit diagram of FIG. 3, under a condition that a voltage for driving the switching transistor 183 is supplied to the first switching line 187, if a voltage is given to the second switching line, an electric charge is stored in the voltage holding capacitor 185, and a voltage is applied to the gate 194b of the current applying transistor 184. Thus, an electric current from the current source 191 is supplied through the source 193b and the drain 195b to the light emitting element 182, and further flows to the ground 190 after it has passed through the light emitting element 182 Thus, when the voltage is not supplied to any one of the first switching line 187 and the second switching line 188, since the voltage is not applied to the gate 194b of the current applying transistor 184, no electric current will flow through the light emitting element 182.

On the other hand, if a transistor driving voltage is supplied to the first line 206a for the light sensor switching, and at the same time, if voltage is supplied to the second line 206b for the light sensor switching, a voltage is applied to the gate 194c of the first switching transistor 208a for the light sensor switching, so that the source 193c and the drain 195c of the transistor 208a become equipotential, with the result that a path between the source 193d and the drain 195d of the second switching transistor 208b for the light sensor switching becomes conductive. At this time, if the light sensor 209 is in a condition capable of detecting the light to generate an electric current, an electric current flows from a current detecting terminal 210 to the ground 190, so that the current is detected by a current detecting circuit (not shown) connected between the current detecting terminal 210 and the ground 190.

Accordingly, if it is so configured that the light emitted from the light emitting element 182 can be received by the light sensor, the light emitting element can be on-off controlled by on-off controlling the voltages supplied to the first switching line 187 and the second switching line 188, and the luminous intensity of the light emitting element 182 can be detected by the luminous intensity monitor 209 at a desired timing by on-off controlling the voltages supplied to the first line 206a and the second line 206b for the light sensor switching.

Figure 4:
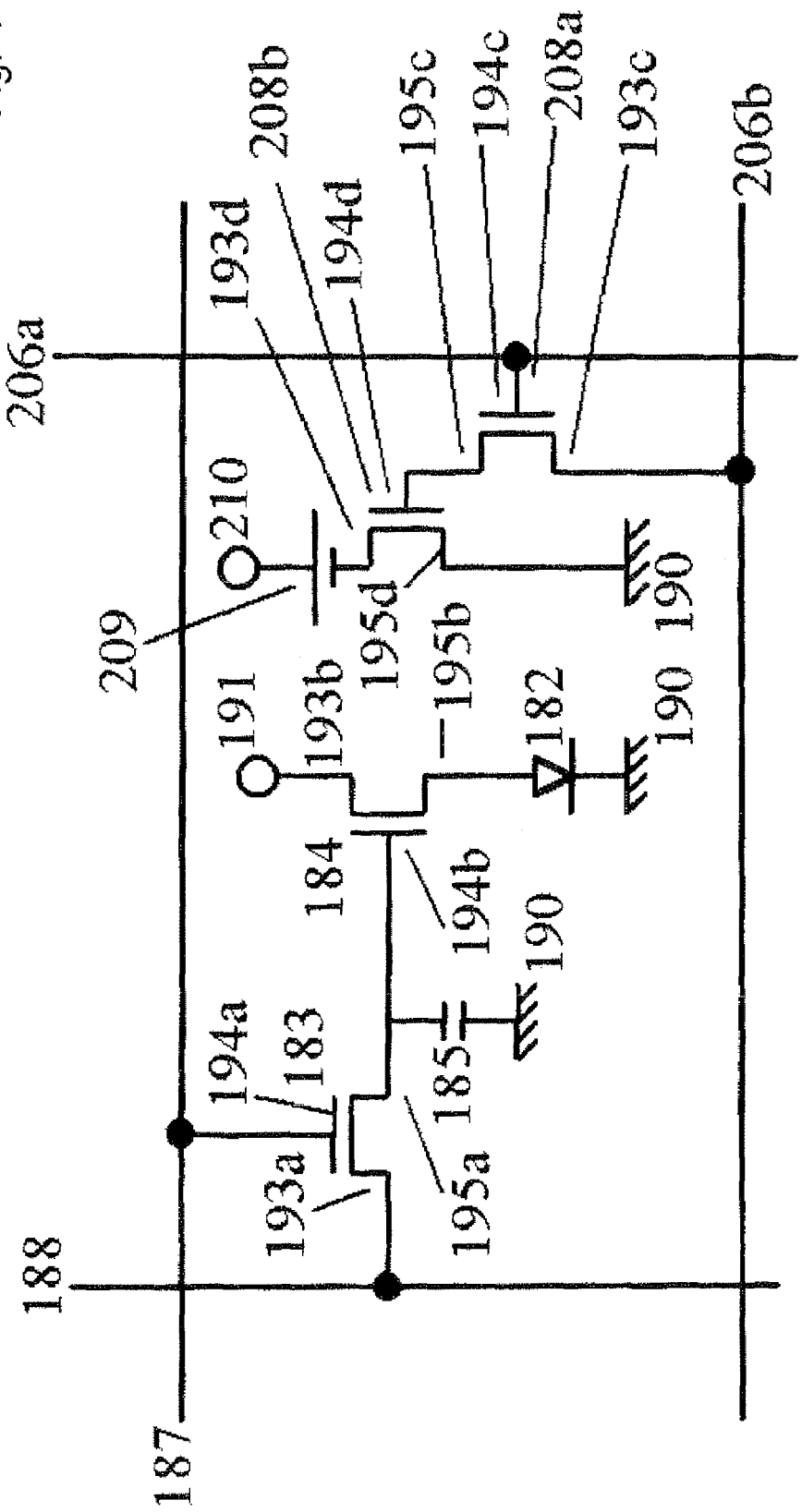
FIG. 4 is a circuit diagram illustrating the light emitting system in accordance with the present invention.

FIG. 4 illustrates an example in which the structure shown in FIG. 3 is so modified that the anode of the light sensor 208 is connected to the source 193d of the second transistor 208b for the light sensor switching, and the cathode of the light sensor 208 is connected to the current detecting terminal 210, and further, the drain 195d of the second transistor 208b is connected to the ground 195.

Figure 5:
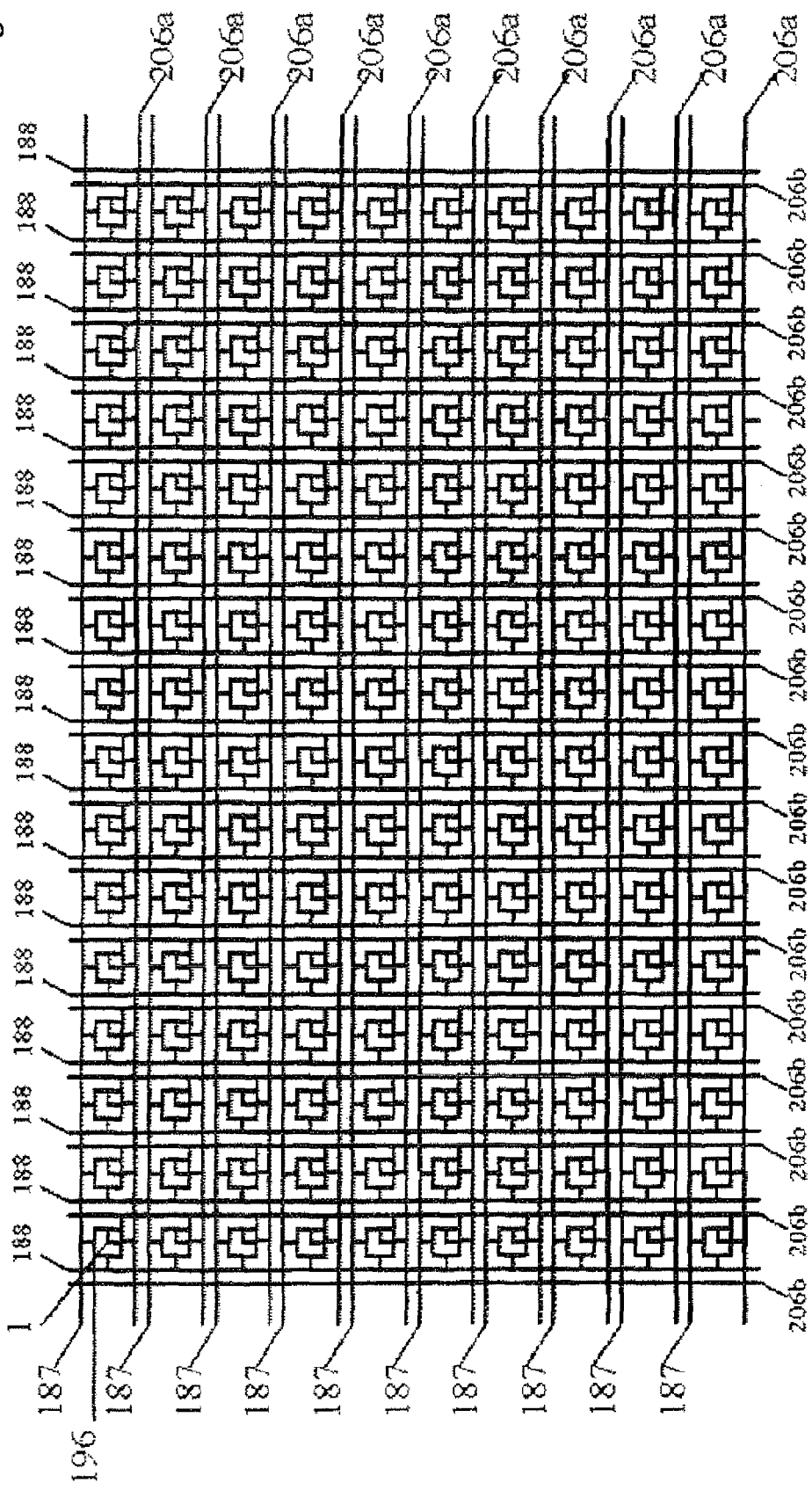
FIG. 5 is a diagrammatic plan view illustrating a placement example of the wiring in the light emitting system in accordance with the present invention.

FIG. 5 is a layout diagram illustrating a placement example, in the light emitting system, of the light sensors 1, the light emitting elements 196, the first switching lines 187, the second switching lines 188, and the first lines 206a and the second lines 206b for the light sensor switching. Here, the current supplying line and the ground line are omitted.

The switching lines 187, the second switching lines 188, and the lines 206 for the light sensor switching are located as shown. The light emitting elements 196 are connected to the first switching lines 187 and the second switching lines 188, and the light sensors 1 are connected to the first lines 206a and the second lines 206b for the light sensor switching. In this construction, by selecting a combination of the first switching lines 187 and the second switching lines 188 to be supplied with the voltage, it is possible to cause an arbitrary light emitting element 196 to emit light. By selecting a combination of the first lines 206a and the second lines 206b, for the light sensor switching, to be supplied with the voltage, it is possible to measure the current corresponding to the luminous intensity of the light detected by an arbitrary light sensor.

Figure 6:
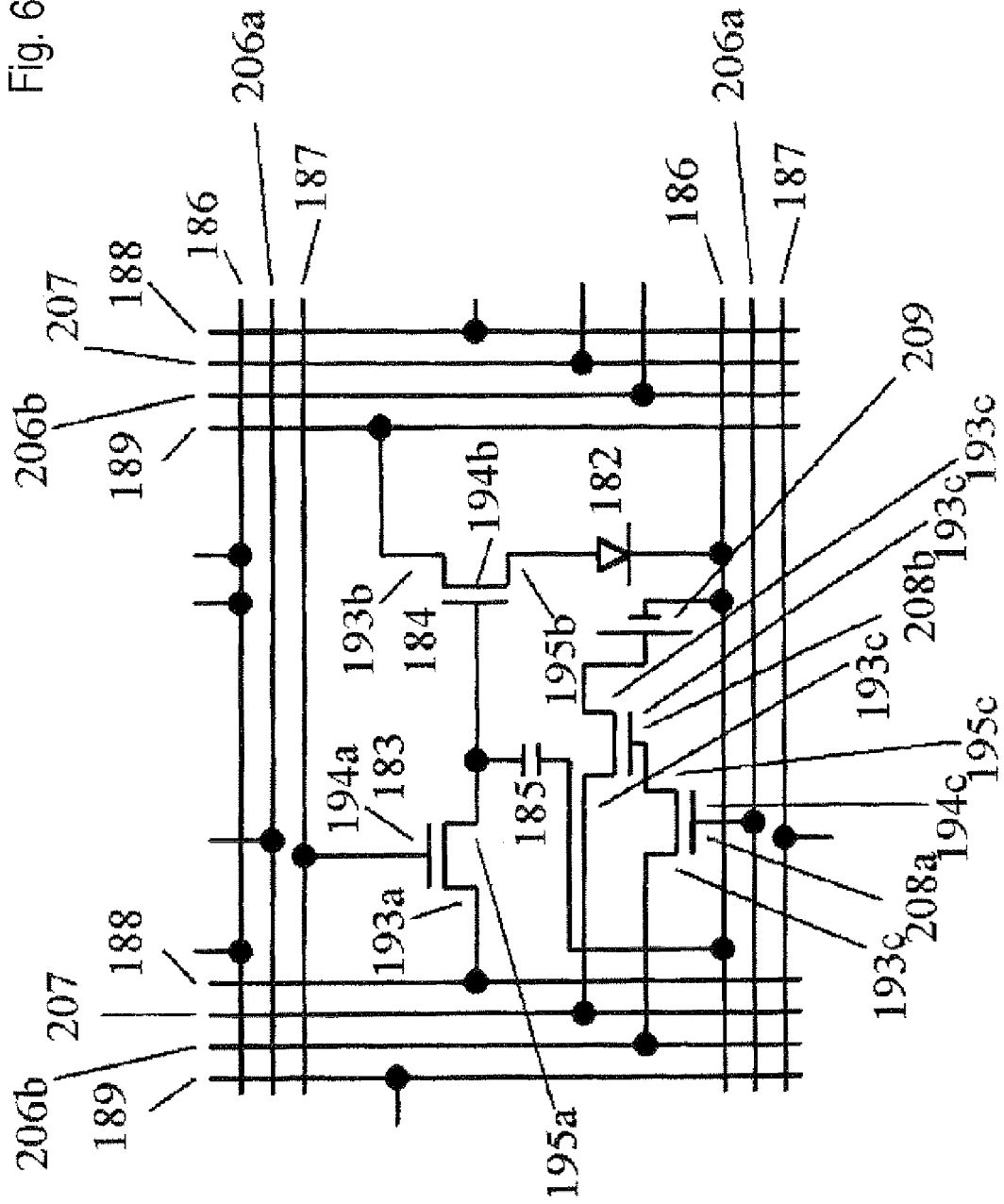
FIG. 6 is a circuit diagram illustrating the light emitting system in accordance with the present invention.

FIG. 6 is a detailed circuit diagram of the peripheral circuit of the light emitting device shown in FIG. 4, which additionally illustrates the ground lines 186 and the current supplying lines 189.

Figure 7:
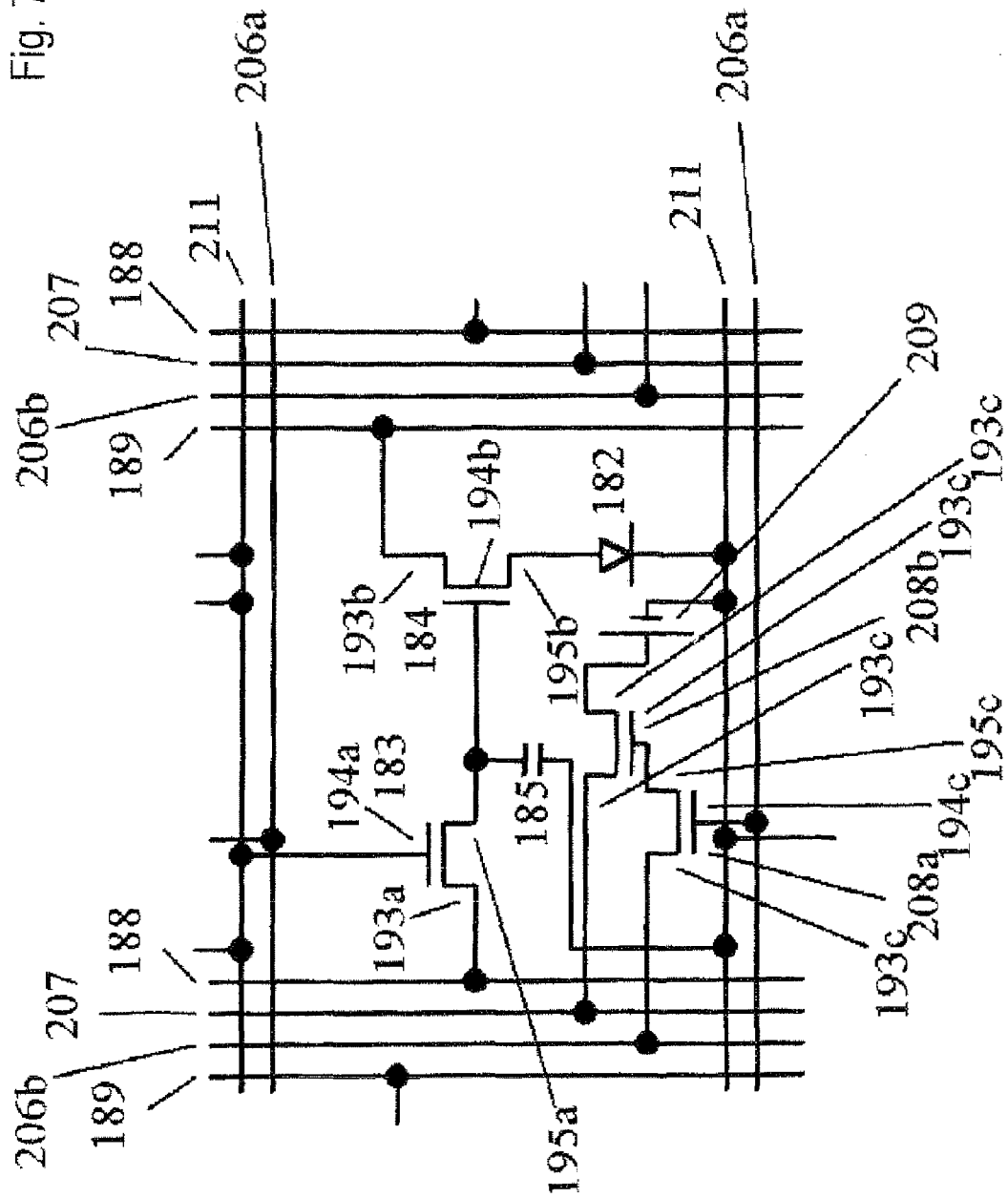
FIG. 7 is a circuit diagram illustrating the light emitting system in accordance with the present invention.

FIG. 7 illustrates an example of the structure shown in FIG. 6, so modified that the ground line 186 and the first switching line 187 are replaced, as a common line, by a first switching line 211 functioning as the ground line.

In some case, the ground line can function not only as the first switching line 187 but also as the second switching line 188 or the first lines 206a or the second lines 206b for the light sensor switching.

Figure 8A:
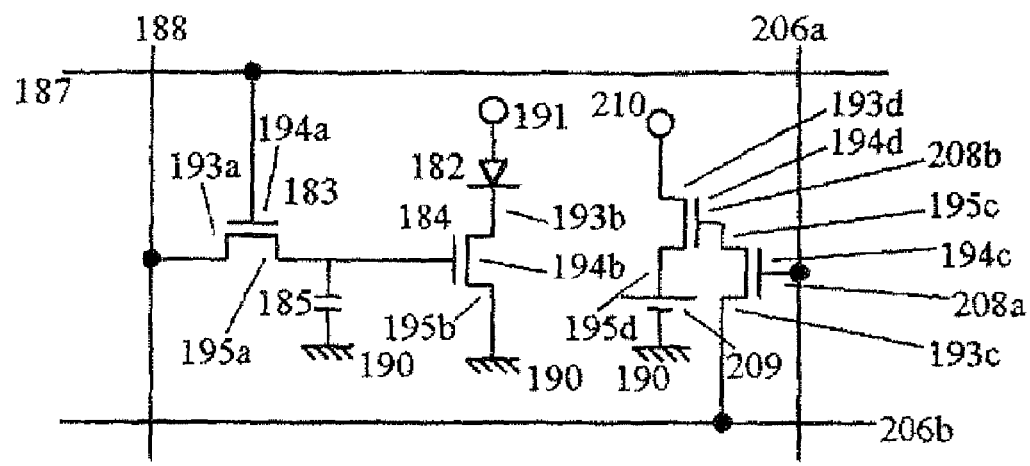
FIGS. 8A and 8B are circuit diagrams illustrating the light emitting system in accordance with the present invention.

FIG. 8A illustrates an example of the structure shown in FIG. 3, so modified that the current source 191 is connected to the anode of the light emitting element 182, whose cathode is connected to the source 193b of the current applying transistor 184 having the drain 195b connected to the ground.

Figure 8B:
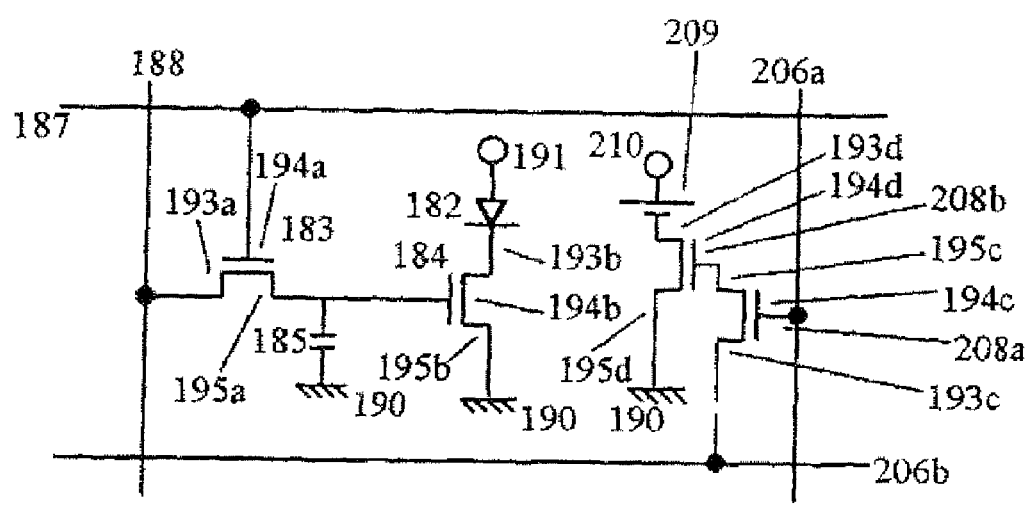

FIG. 8B illustrates an example of the structure shown in FIG. 8A, so modified that the anode of the light sensor 209 is connected to the source 183d of the second transistor 208b for the light sensor switching, and the cathode of the light sensor is connected to the current detecting terminal 210. The drain 195d of the second transistor 208b is connected to the ground 195.

Figure 9:
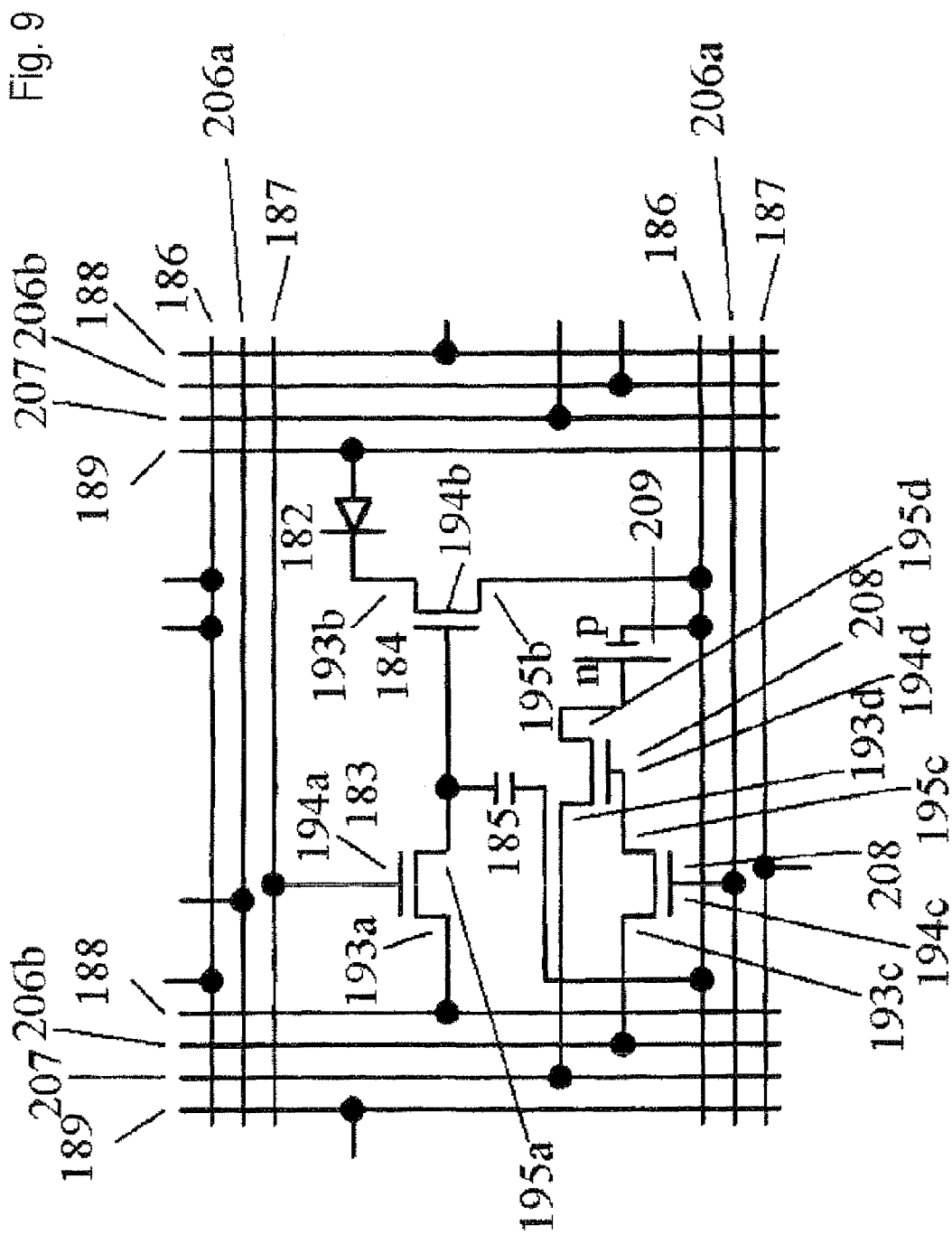
FIG. 9 is a circuit diagram illustrating the light emitting system in accordance with the present invention.

FIG. 9 is a detailed circuit diagram of the peripheral circuit of the light emitting device shown in FIG. 8A, which additionally illustrates the ground lines 186 and the current supplying lines 189.

Figure 10:
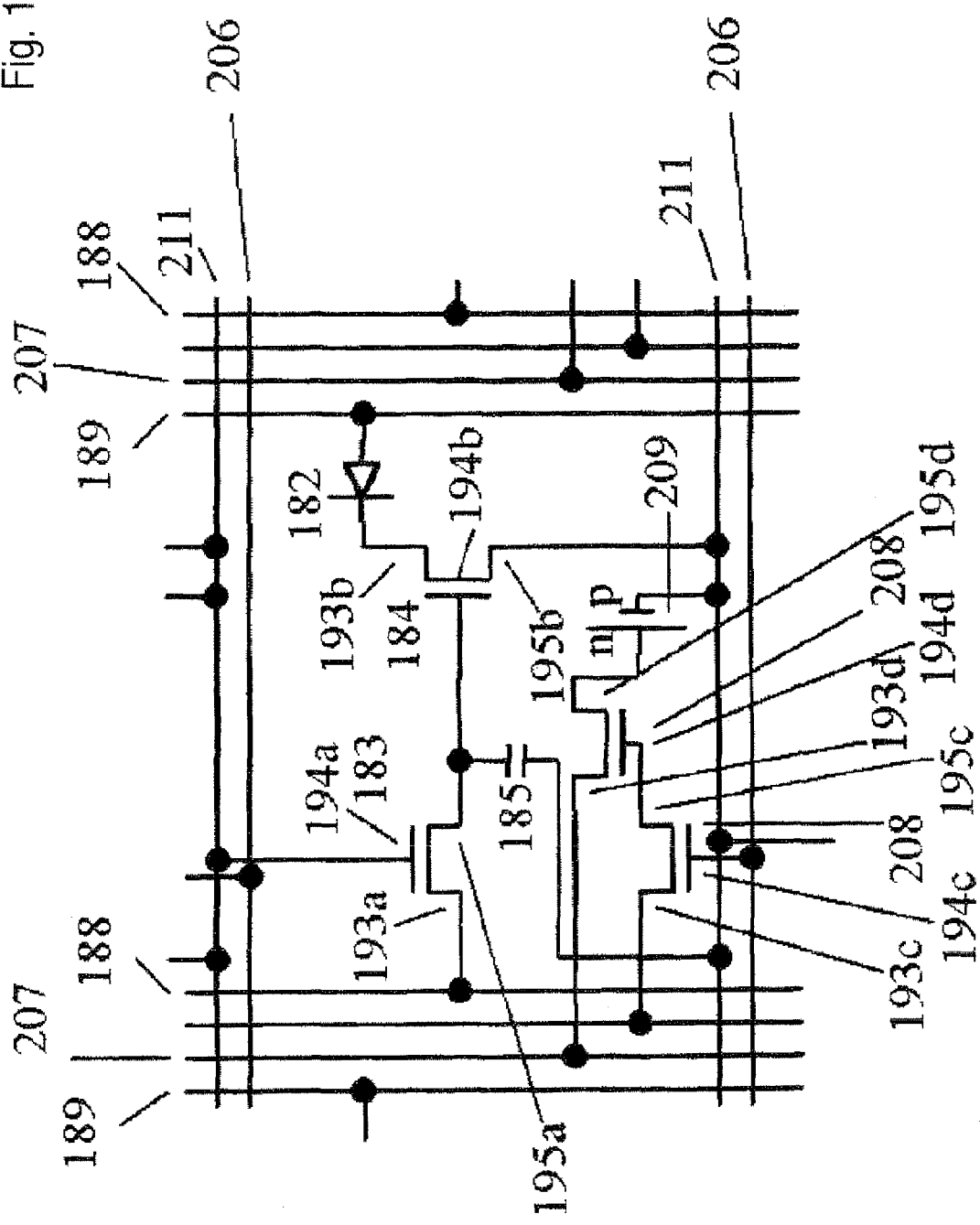
FIG. 10 is a circuit diagram illustrating the light emitting system in accordance with the present invention.

FIG. 10 illustrates an example of the structure shown in FIG. 9, so modified that the ground line 186 and the first switching line 187 are replaced, as a common line, by a first switching line 21 functioning as the ground line.

In some case, the ground line can function not only as the first switching line 187 but also as the second switching line 188 or the first lines 206a or the second lines 206b for the light sensor switching.

Next, a detailed structure of the light emitting element of the present invention and its peripheral portion shown in FIGS. 3 to 10, will be described.

Figure 11:
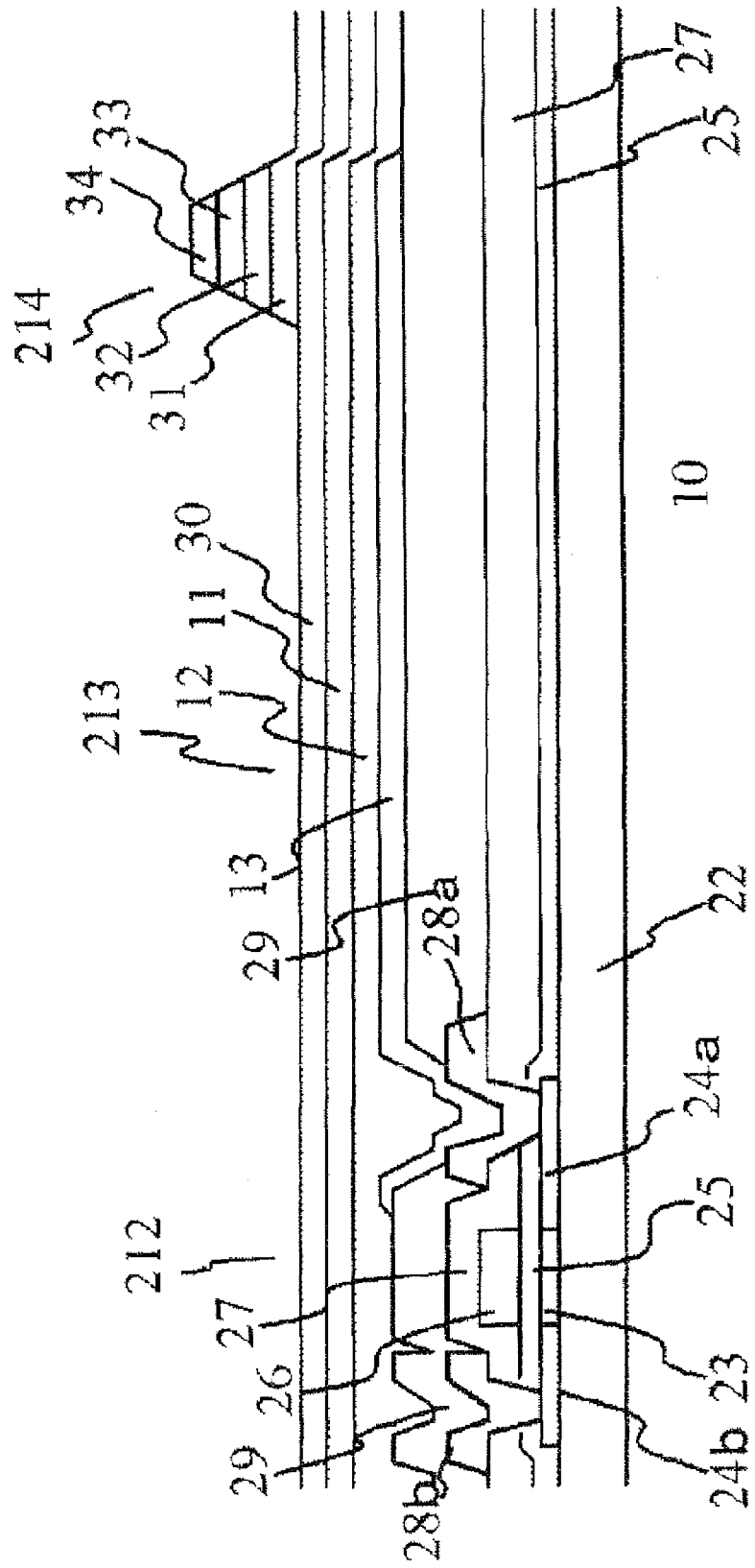
FIG. 11 is a diagrammatic sectional view illustrating the light emitting system in accordance with the present invention.

FIG. 11 is a typical diagrammatic sectional view illustrating the light emitting element of the present invention and its peripheral portion. This shows an example in which light is emitted toward to an upper direction in the drawing. In this drawing, a light emitting element 213, a current applying element part 212 for the light emitting element and a light sensor part 214 are illustrated.

In this structure, a barrier layer 22 is formed on a substrate 10. On the barrier layer 22, a channel region (gate region) 23, a source region 24a and a drain region 24b of a thin film transistor (TFT) are formed as shown. A gate insulator film 25 is formed on the thin film transistor. Holes are formed through the gate insulator film 25 at positions corresponding to the source region 24a and the drain region 24b of the TFT, respectively. A gate electrode 26 is formed on a portion of the gate insulator film 25 corresponding to the channel region 23 of the TFT. The gate electrode 26 is connected to an interconnection (not shown). A first interlayer insulator film 27 is formed on the gate electrode 26, but holes are formed through the first interlayer insulator film 27 at positions corresponding to the source region 24a and the drain region 24b of the TFT, respectively. A source electrode 28a and a drain electrode 28b are formed in these holes to contact with the source region 24a and the drain region 24b, respectively. A second interlayer insulator film 29 are formed to cover the whole surface excluding a portion above the source electrode 28a, as shown. The drain electrode 28b is connected to a switching element although it is not shown. Furthermore, a patterned lower electrode 13 is formed on the structure thus obtained so that the lower electrode 13 is connected to the source electrode 28a. On the lower electrode 13, a light emitting material layer 12 and an upper electrode 11 are formed in the named order.

The light emitting material layer 12 can be formed of a triple-layer film composed of an electron injection and transport layer, a light emitting layer and a hole injection and transport layer, a double-layer film composed of a light emitting layer functioning as the electron injection and transport layer, and a hole injection and transport layer, or a single-layer film composed of a light emitting layer functioning as the electron injection and transport layer as well as the hole injection and transport layer. The hole injection and transport layer is formed between the light emitting layer and the electrode, of the upper electrode and the lower electrode, functioning as an anode when a voltage is applied to supply an electric current to the light emitting material layer. The electrode injection and transport layer is formed between the light emitting layer and the electrode, of the upper electrode and the lower electrode, functioning as a cathode when the voltage is applied to supply the electric current to the light emitting material layer.

In addition, the example in which the light emitting material layer 12 and the upper electrode 11 are patterned in units of element, but can be patterned to a large pattern covering a plurality of elements.

A light emitting part of the element is constituted of an overlapping portion of the lower electrode 13 and the upper electrode 11. In this structure, the light emitting direction is an upper direction in the drawing.

On the upper electrode 11, a third interlayer insulator film 30 is formed as shown. On the third interlayer insulator film 30, a patterned lower electrode 31 formed of a transparent electrode film, of the sensor part, is formed. The patterned lower electrode 31 of the sensor part is connected to an interconnection (not shown). On the second transparent electrode pattern 31, a p-type semiconductor 33 and an n-type semiconductor 33 are formed to form a pn junction therebetween. Furthermore, an upper electrode 34 of the sensor part is formed on the semiconductors thus formed, and is connected to an interconnection (not shown). Here, the sensor part will be never limited to this shown shape, as will be explained hereinafter.

Figure 12:
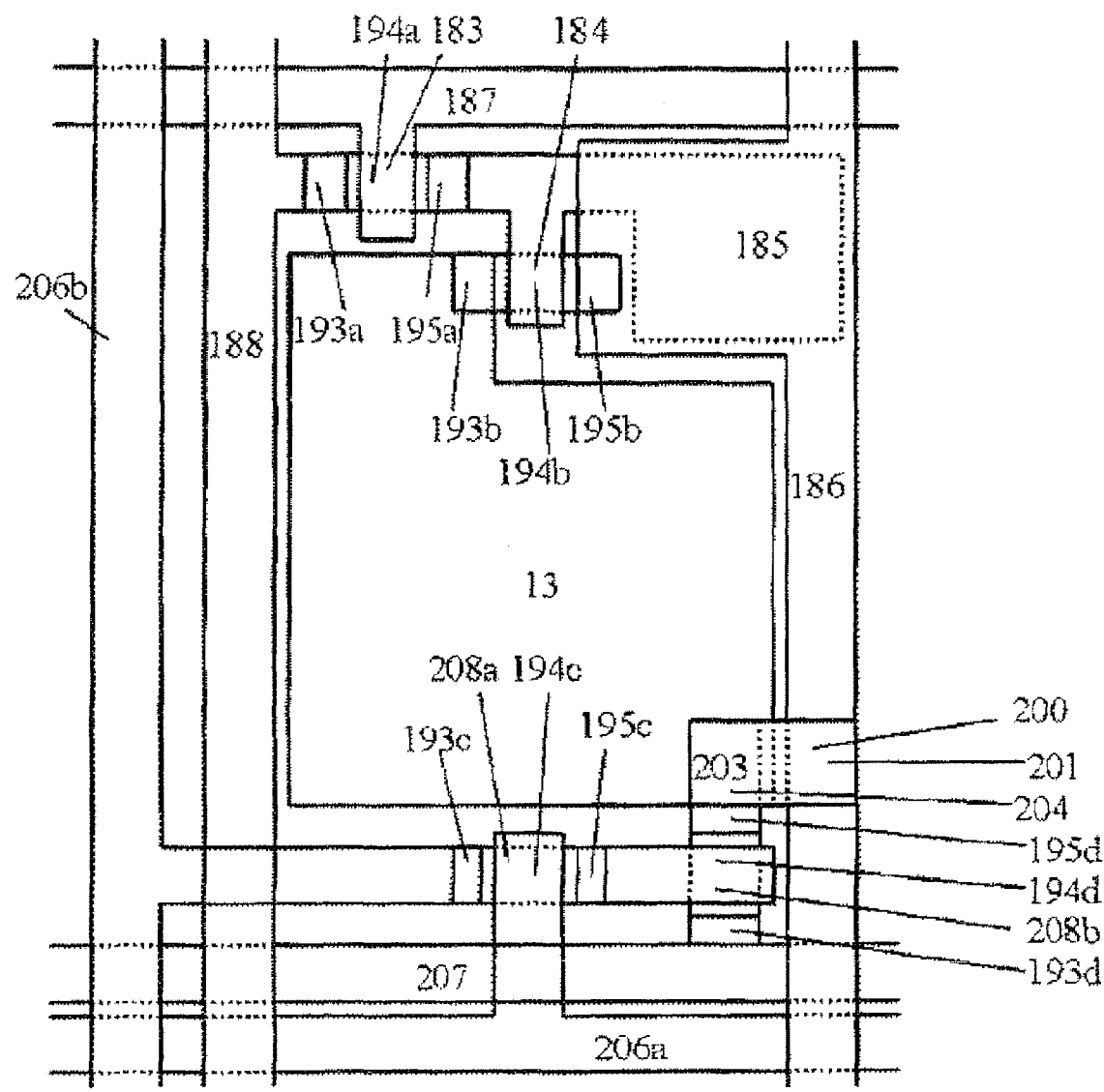
FIG. 12 is a diagrammatic plan view illustrating the light emitting system in accordance with the present invention.

FIG. 12 is a typical diagrammatic plan view illustrating the light emitting element having the sectional structure shown in FIG. 11 and its peripheral portion including the interconnection. The first switching line (gate line) 187 is connected to the gate 194 of the switching transistor 183. The second switching line (data line) 188 is connected to the source 193a of the switching transistor 183. The drain of the switching transistor 183 is connected to the gate 194b of the current applying transistor 184 and one terminal (an underlying electrode of a portion designated by 185 in the drawing) of the voltage holding capacitor 185 that is formed between the ground line 186 and the underlying electrode. The other terminal (an overlying electrode of a portion designated by 185 in the drawing) of the voltage holding capacitor 185 is connected to the ground line 186. The source 193b of the current applying transistor is connected to the lower electrode 13. To cover the whole surface of the drawing, the light emitting material layer and the upper electrode layer (both not shown) are formed in the named order, and the upper electrode is connected to the current supplying source (not shown). A light emitting region is defined by the pattern of the lower electrode 13. The drain 195b of the current applying transistor 184 is connected to the ground line 186. Above a portion of the light emitting element, the light sensor is formed, which includes the pn junction portion 203 sandwiched between the sensor upper electrode 204 and the second transparent electrode 200 of the sensor lower electrode. Although not shown, the n-type semiconductor of the pn junction portion is contacted with the sensor lower electrode, and the p-type semiconductor of the pn junction portion is contacted with the sensor upper electrode. The second transparent electrode 200 is connected to the ground line 186, and the sensor upper electrode 204 is connected to the drain 195d of the second transistor 208b for the light sensor switching. The source 193d of the second transistor 208b for the light sensor switching is connected to the light sensor current detecting line 207, and the gate 194d of the second transistor 208b is connected to the drain 195c of the first transistor 208a for the light sensor switching, The gate 194c of the first transistor 208a is connected to the first line 206a for the light sensor switching. The source 193c is connected to the second line 206b for the light sensor switching.

Now, a typical process for fabricating the light emitting element in accordance with the present invention (the structure shown in FIG. 11) will be described with reference to FIGS. 13A to 13R. Here, the lower electrode is the cathode, and the upper electrode is the anode.

Figure 13A:
FIGS. 13A to 13R are diagrammatic sectional views illustrating the process for fabricating the light emitting system in accordance with the present invention.
Figure 13B:
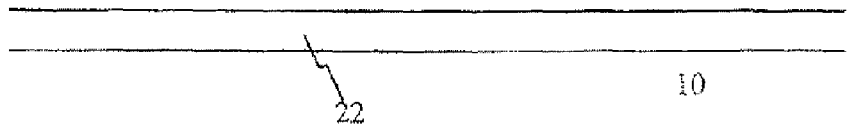
Figure 13C:
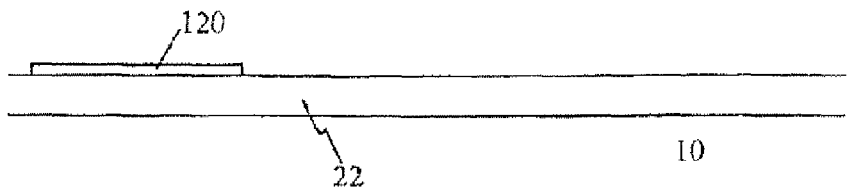

First, a substrate 10 is prepared as shown in FIG. 13A. For example, the substrate 10 is formed of a non-alkali glass. On this substrate, a barrier layer 22 is deposited by sputtering or a C V D (chemical vapor deposition) process, as shown in FIG. 13B. As shown in FIG. 13C, on the barrier layer 22, a silicon film 120 is deposited by the sputtering or the CVD process, typically by a LP-CVD (low pressure CVD) process with a temperature of 500 degrees Celsius, and is converted into polycrystal by irradiating laser.

Figure 13D:
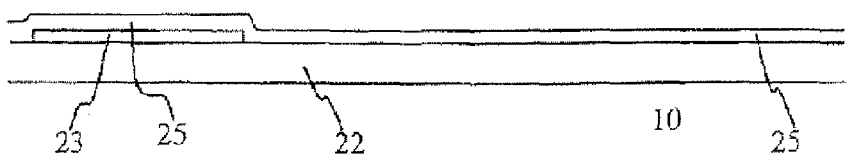
Figure 13E:
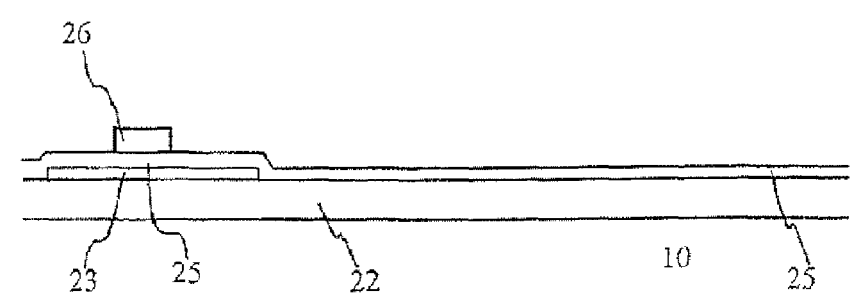

Next, as shown in FIG. 13D, a gate insulator film 25 is formed by the sputtering or the CVD process. Typically, a $SiO_2$ film is deposited by a remote plasma CVD process. As shown in FIG. 13E, a patterned gate electrode 26 is formed on the gate insulator film 25. The formation of the patterned gate electrode can be realized by depositing a gate electrode film typified by a WSi film by for example the sputtering or vapor deposition, by spin-coating a photoresist film, by patterning the photoresist film by means of exposure using an optical mask and development, by removing the gate electrode film that is not covered by the patterned photoresist film, by means of milling, and by removing the remaining photoresist film by dissolving the same with a solvent.

Figure 13F:
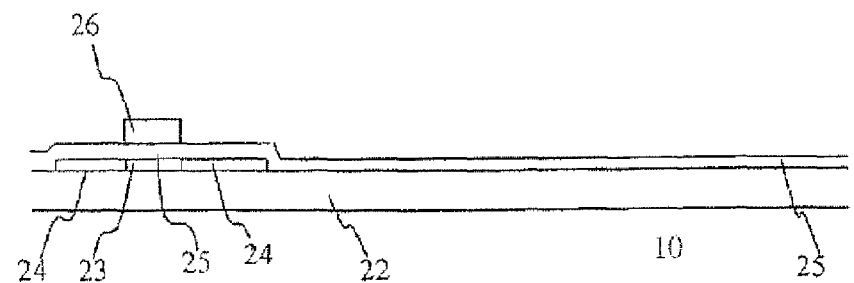

Furthermore, after forming a resist to cover a region other than a portion where the silicon film have been formed, boron or phosphorus is ion-doped, so that a source region and a drain region are formed as shown in FIG. 13F. In addition, in order to activate the source region and the drain region, a heat treatment is carried out at a temperature of 550 degrees Celsius, typically.

Figure 13G:
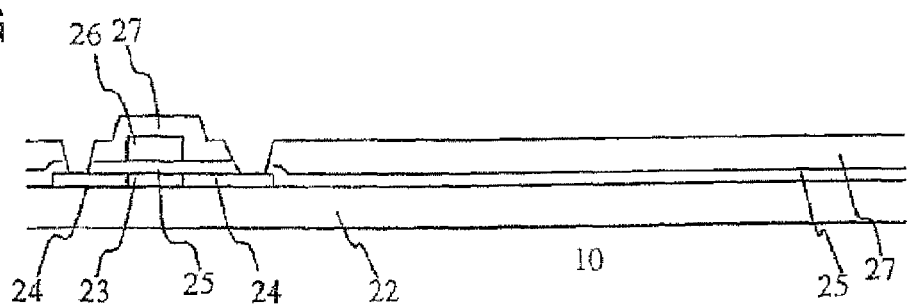

Then, as shown in FIG. 13G, a first interlayer insulator film typified by a $SiO_2$ film, is formed by the sputtering or the CVD process, and a portion of the gate insulator film and the first interlayer insulator film, formed to cover the source region and the drain region, is selectively removed. At this time, the above mentioned method used for patterning the gate electrode 26 can be used.

Figure 13H:
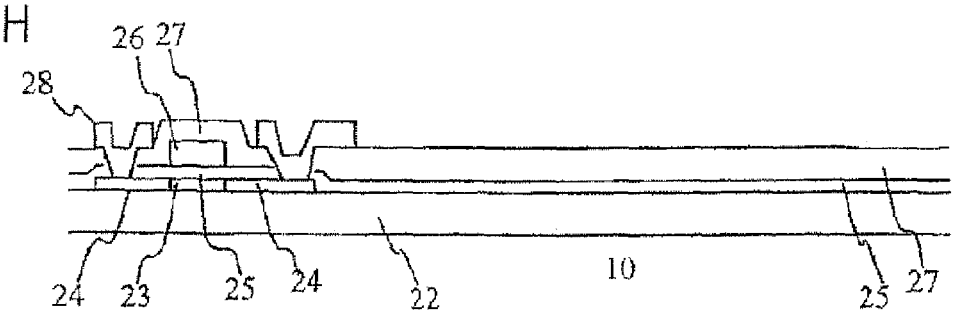

Thereafter, as shown in FIG. 13H, source/drain electrodes 28 typified by a patterned aluminum film are formed. At this time, the above mentioned method used for patterning the gate electrode 26 can be used.

Figure 13I:
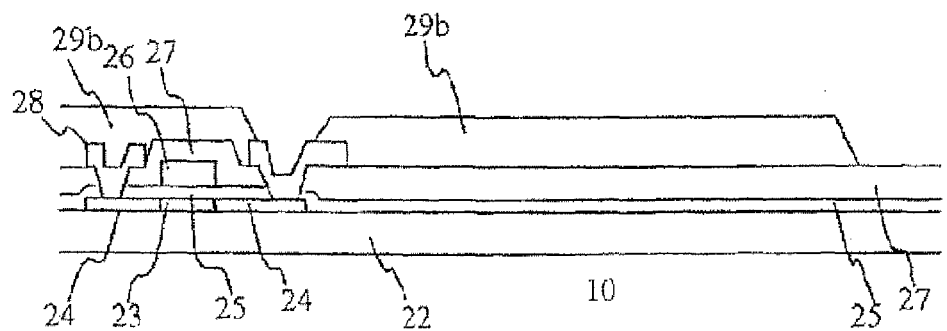

Succeedingly, as shown in FIG. 13I, a second interlayer insulating film 29 typified by a patterned $SiO_2$ film is formed on the structure thus formed. At this time, the above mentioned method used for patterning the gate electrode 26 can be used.

Figure 13J:
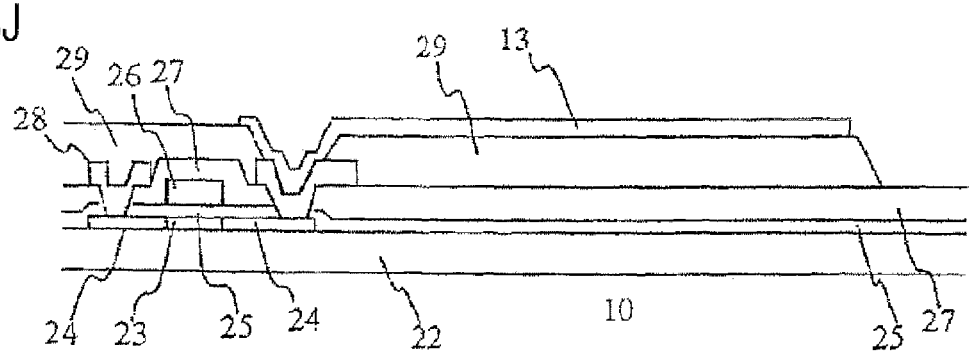

Next, a patterned lower electrode 13 is formed as shown in FIG. 13J. At this time, the above mentioned method used for patterning the gate electrode 26 can be used.

Figure 13K:
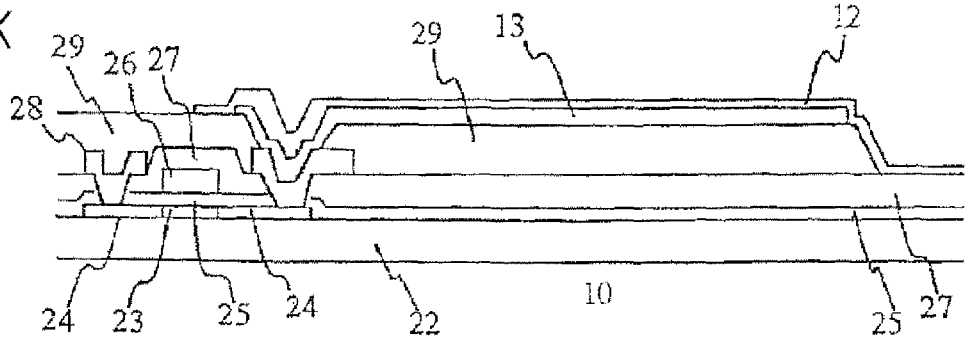

Furthermore, a patterned light emitting material layer 12 is formed as shown in FIG. 13K on the structure thus formed. At this time, an deposition method using a metal mask, or a forming method using an ink jet head can be used.

Figure 13L:
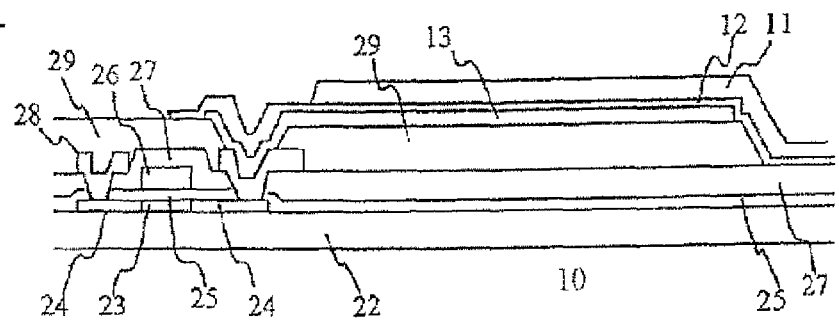

Then, an upper electrode 11 is formed as shown in FIG. 13L. The upper electrode 11 can be deposited by the sputtering, the CVD process or a spin-coating.

Figure 13M:
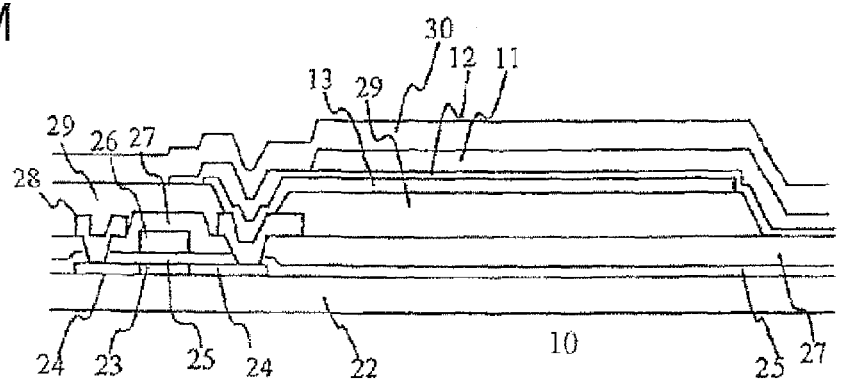

Thereafter, a third interlayer insulator film 30 typified by a $SiO_2$ film is formed on the structure thus formed, by the sputtering or the CVD process, as shown in FIG. 13M.

Figure 13N:
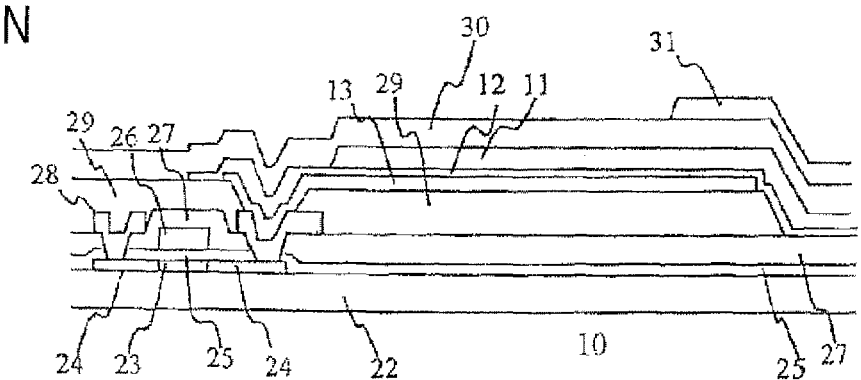

Succeedingly, a patterned sensor lower electrode 31 is formed on the structure thus formed, by the sputtering or the CVD process, as shown in FIG. 13N. At this time, the above mentioned method used for patterning the gate electrode 26 can be used.

Figure 13O:
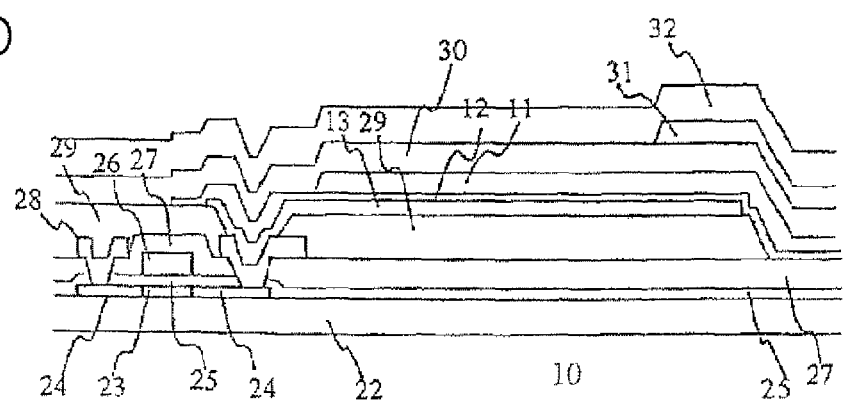

Next, as shown in FIG. 13O, an n-type semiconductor film typified by a phosphorus (P)-doped silicon film is deposited by the sputtering, and a heat treatment is carried out for composition stabilization.

Figure 13P:
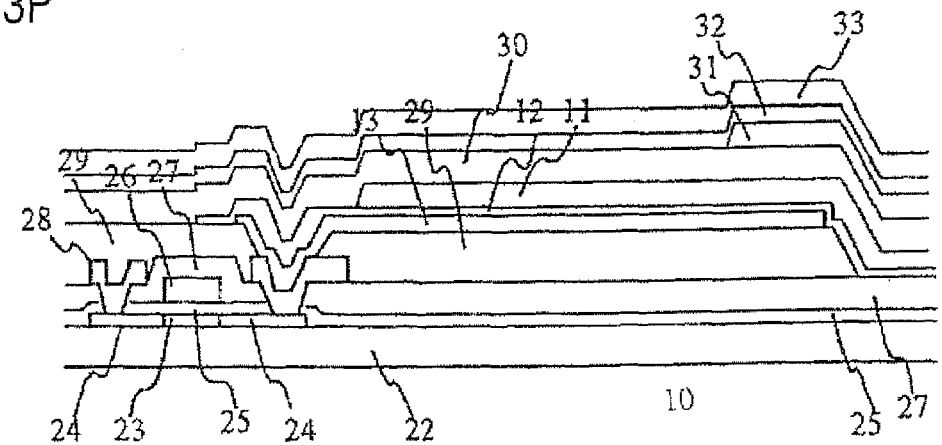

Furthermore, boron (B) is doped by an ion-doping method so that an upper layer of the silicon layer is converted into a p-type semiconductor layer 33 as shown in FIG. 13P, with the result that the pn junction is formed.

Figure 13Q:
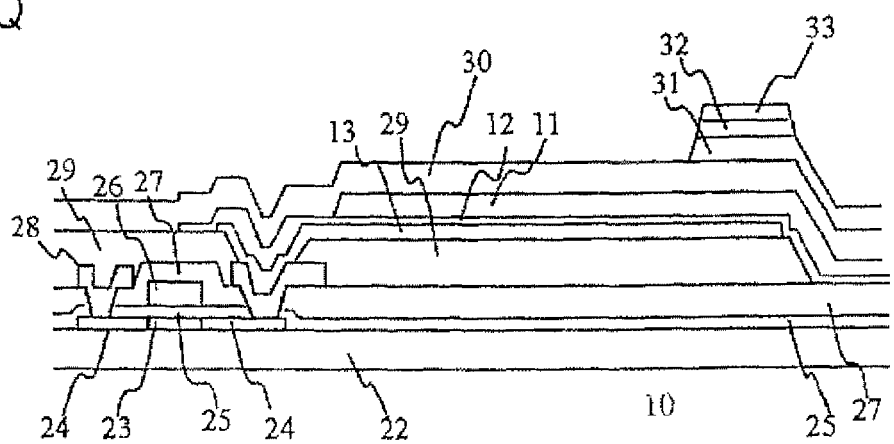

Then, as shown in FIG. 13Q, the pn junction layer is patterned. At this time, the above mentioned method used for patterning the gate electrode 26 can be used.

Figure 13R:
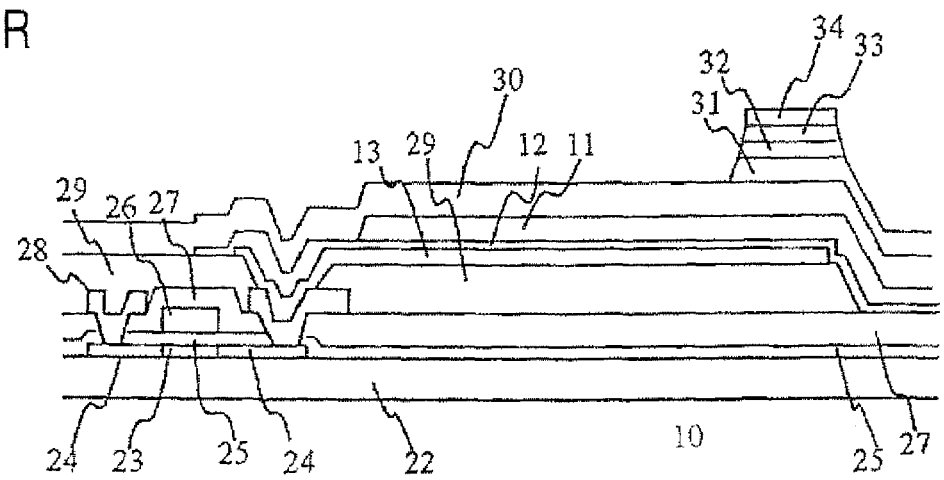

Thereafter, as shown in FIG. 13R, a patterned sensor upper electrode 34 is formed. At this time, the above mentioned method used for patterning the gate electrode 26 can be used.

Typical material of each of various members constituting the light emitting element can be exemplified as follows:

The material of the lower electrode (cathode) is not limited, but the lower electrode can be formed of preferably Ti, Al, AlLi, Cu, Ni, Ag, AgMg, Au, Pt, Pd, Ir, Cr, Mo, W, Ta, etc.

The thickness of the lower electrode is sufficient if it is not less than a predetermined thickness sufficient to inject electrons. The thickness of the lower electrode is preferably in the range of 50 to 500 nm, and more specifically in the range of 50 to 300 nm. In addition, the resistivity of the metal used as the lower electrode is preferably in the range of $1\times10^{-3}$ to $1\times10^{-6}$ $\Omega \cdot cm$.

The lower electrode can be formed by means of vapor deposition, but is formed preferably by the sputtering, more preferably by the DC-sputtering. The power of a DC sputtering machine is preferably in the range of 0.1 to 10 $W/cm^2$, and more preferably in the range of 0.5 to 7 W/cm$^2$. The deposition rate is preferably in the range of 0.1 to 100 nm/min, and more preferably in the range of 1 to 30 nm/min.

A sputtering gas is not limited, but an inert gas typified by Ar, He, Ne, Kr, Xe, or a mixed gas of these inert gases can be used. It is sufficient if the pressure of the sputtering gas in the sputtering is ordinarily on the order of 0.1 to 20 Pa.

For the upper electrode (anode), it is preferred to select the material and the film thickness capable of achieving the transmittance of the generated light of not less than 80%. Specifically, a transparent conductive oxide film is preferred. For example, a principal component is preferably composed of tin-doped indium oxide (ITO), zinc-doped indium oxide (IZO), indium oxide (In$_2$O$_3$), tin oxide (SnO$_2$) and zinc oxide (ZnO). Particularly, zinc-doped indium oxide (IZO) is preferred. In order to elevate reliability of the element, it is necessary to lower the drive voltage, and in order to realize a high efficiency, the anode material of a low resistivity is required. Since the resistivity of the IZO film just after film deposition is sufficient low, the heat treatment is not necessary, and therefore, the organic EL element is not substantially damaged by the heating.

These oxide can be deviated from a stoichiometric composition to some degree. For example, ITO ordinarily include In$_2$O$_3$ and SnO$_2$ in stoichiometric composition, but the amount of oxygen can be deviated from the stoichiometric composition.

In ITO, a mixed ratio of SnO$_2$ to In$_2$O$_3$ is preferably 1 to 20 weight %, and more preferably 5 to 12 weight %. In IZO, a mixed ratio of ZnO$_2$ to In$_2$O$_3$ is preferably 12 to 32 weight %.

The upper electrode is deposited by preferably the sputtering. As the sputtering, it is possible to use a high frequency sputtering using a RF power supply, but the DC sputtering is preferable, since it is easy to control the film physical property of the upper electrode to be deposited, and in view of the degree of planarity of the deposited film surface.

A magnetron DC sputtering machine is preferred as the DC sputtering machine. As a magnetic field strength, a magnetic flux density B on the target is preferably 500 to 2000 Gauss, more preferably 800 to 1500 Gauss. It is preferred that the magnetic flux density B on the target is larger. If the magnetic flux density is increased to elevate the magnetic field strength, if an electrode structure is configured to constrain electrons in the neighborhood of the target, the number of ions colliding against the cathode target in the sputtering gas within the plasma increases with the result that the plasma density becomes large. If the plasma density becomes large, the number of mutual collisions of particles within the plasma increases, so that the sputtered particles are gently deposited on the substrate. A method for creating the magnetic field on the target is not limited, but it is preferred to locate a magnet on a rear side of the target, particularly, within a cooling unit. As the magnet for generating such a magnetic field, for example, Fe—Nd—B, Sm—Co, a ferrite, Alnico magnet can be exemplified. Particularly, Fe—Nd—B and Sm—Co are preferable since it is possible to obtain a large magnetic flux density.

As for a biasing voltage, a voltage between the target and the substrate (bias electrode) is preferably in the range of 100 to 300 V, more preferably in the range of 150 to 250 V. If the biasing voltage is too high, the acceleration of the particles becomes too large, so that the electrode layer is apt to be damaged. On the other hand, if the biasing voltage is too low, it becomes impossible to sustain the plasma discharge, or the plasma density becomes low so that it becomes difficult to obtain the above mentioned advantage.

Incidentally, within the above mentioned ranges, the magnetic field strength and the biasing voltage are preferably adjusted to a optimum value so as to conform with the operating condition, the machine scale and others.

The power of the DC sputtering machine is preferred in the range of 0.1 to 10 W/cm$^2$, and more preferably in the range of 0.5 to 7 W/cm$^2$. The deposition rate is dependent upon the machine condition such as the magnet, and is preferably in the range of 5 to 100 nm/min, and more preferably in the range of 10 to 50 nm/min. The deposition condition in the sputtering is sufficient if the gas pressure is on the order of 0.1 to 0.5 Pa and the substrate-to-target distance is in the range of 4 to 10 cm, which are conventionally used in the electrode formation.

As the sputtering gas, it is possible to use the inert gas which is used in the conventional sputtering machine. In a reactive sputtering, it is possible to use a reactive gas exemplified by N$_2$, H$_2$, O$_2$, C$_2$H$_4$, NH$_3$, etc., in addition to the inert gas. However, it is preferred to use any of Ar, Kr and Xe, or alternatively a mixed gas including at least one of Ar, Kr and Xe. Since these gases are an inert gas and have a relatively large atomic weight, a single gas of Ar, Kr or Xe is preferred. By using the gas of Ar, Kr or Xe, the sputtered atoms repeatedly collide with the gas in the course until the sputtered atoms arrive the substrate, so that the sputtered atoms arrive the substrate after the kinetic energy is reduced. As a result, the physical damage to the organic EL structure by the kinetic energy of the sputtered atoms can be minimized. In addition, it is possible to use a mixed gas including at least one of Ar, Kr and Xe. When such a mixed gas is used, it is preferred to use a main sputtering gas so prepared that the total of the partial pressures of Ar, Kr and Xe is not less than 50%. By using a mixed gas containing at least one of Ar, Kr and Xe and an arbitrary gas, it is possible to carry out the reactive sputtering while maintaining the advantage of the present invention.

The thickness of the upper electrode is sufficient if it is not less than a predetermined thickness sufficient to inject and transport holes. The thickness of the upper electrode is preferably in the range of 50 to 500 nm, and more specifically in the range of 50 to 300 nm. The thickness of the upper electrode does not have an upper limit. However, if the thickness of the upper electrode is too large, a fear of detachment would occur. On the other hand, if the thickness of the upper electrode is too small, a problem would be encountered in connection with the film strength when the film is formed, and in connection with the capability of the hole transportation.

Next, the organic material layer used in the organic EL structure of the present invention will be described.

The light emitting layer has the function of injecting holes (positive hole) and electrons, the function of transporting the holes and the electrons, and the function of generating exciters by the hole-electron recombination. The light emitting layer is preferred to be formed of a compound which is relatively electronically neutral.

The hole injection and transport layer has the function of facilitating the injection of the holes from the upper electrode and the function of stably transporting the holes but preventing the transport of the electrons. The electron injection and transport layer has the function of facilitating the injection of the electrons from the cathode and the function of stably transporting the electrons but preventing the transport of the holes. These layers increase and constrain the holes and the electrons injected into the light emitting layer, so as to optimize the recombination region to improve the light emission efficiency.

The thickness of the light emitting layer, the thickness of the hole injection and transport layer, and the thickness of the electron injection and transport layer are not limited and are dependent upon the formation method, but preferably on the order of 5 to 500 nm, more preferably on the order of 10 to 300 nm.

The thickness of the hole injection and transport layer and the thickness of the electron injection and transport layer are dependent upon the design of the recombination and light emission region, and are sufficient if the thickness is equal to the thickness of the light emitting layer or in the range of one tenth to ten times of the thickness of the light emitting layer. If the hole or electron injection and transport layer is divided into an injection layer and a transport layer, the injection layer is preferred to be not less than 1 nm, and the transport layer is preferred to be not less than 1 nm. In this case, the upper limit of the thickness is on the order of 500 nm in the injection layer and on the order of 500 nm in the transport layer. The condition for the film thickness is the same when two layers of injection and transport layer are provided.

The light emitting layer of the present invention includes a fluorescent material which is a compound having the function of emitting light. For example, it is possible to exemplify the compound disclosed in Japanese Patent Application Pre-examination Publication No. JP-A-63-264692, for example, at least one compound selected from a croup comprising quinacridone, rubrene, styryl type pigments. Further, it is possible to exemplify quinoline derivatives such as metal complex pigment whose ligand is 8-quinolinol such as tris(8-quinolinolato) aluminum or its derivatives, tetraphenyl butadiene, anthracene, perylene, coronene and 12-phtalopellinon derivatives. Phenyl anthracene derivatives disclosed in Japanese Patent Application No. Heisei 6-110569 and tetraaryl ethene derivatives disclosed in Japanese Patent Application No. Heisei 6-114456 also can be used.

In addition, it is preferable to use in combination with a host material capable of spontaneously emitting the light. It is preferably used as dopant. In this case, the content of the compound in the light emitting layer is preferably in the range of 0.01 to 10 weight %, more preferably in the range of 0.1 to 5 weight %. If the compound is used in combination with the host material, it is possible to change the emitted light wavelength characteristics of the host material, and generate the light having the wavelength shifted to a longer wavelength, and also to elevate the light emission efficiency and the stability of the light emitting element.

The host material is preferably quinolinolato complex, and more preferably aluminum complex whose ligand is 8-quinolinol or its derivatives. Such aluminum complex is disclosed in Japanese Patent Application Pre-examination Publication Nos. JP-A-63-264692, JP-A-3-255190, JP-A-5-70733, JP-A-5-258859 and JP-A-6-215874.

Specifically, the followings are exemplified: tris(8-quinolinolato)aluminum, bis(8-quinolinolato)magnesium, bis (benz{f}-8-quinolinolato)zinc, bis(2-methyl-8-quinolinolato) aluminum oxide, tris(8-quinolinolato)indium, tris(5-methyl-8-quinolinolato)aluminum, 8-quinolinolato lithium, tris (5-chloro-8-quinolinolato)gallium, bis(5-chloro-8-quinolinolato)calcium, 5,7-dichloro-8-quinolinolato aluminum, tris(5,7-dibromo-8-hydroxy quinolinolato)aluminum, and poly[zinc(II)-bis(8-hydroxy-5-quinolinyl)methane].

The aluminum complex can have another ligand in addition to 8-quinolinol or its derivatives. Examples are bis(2-methyl-8-quinolinolato)(phenolate)aluminum(III), bis(2-methyl-8-quinolinolato)(ortho-cresolate)aluminum(III), bis (2-methyl-8-quinolinolato)(metha-cresolate)aluminum(III), bis(2-methyl-8-quinolinolato)(para-cresolate)aluminum (III), bis(2-methyl-8-quinolinolato)(ortho-phenyl phenolate) aluminum(III), bis(2-methyl-8-quinolinolato)(metha-phenyl phenolate)aluminum(III), bis(2-methyl-8-quinolinolato) (para-phenyl phenolate)aluminum(III), bis(2-methyl-8-quinolinolato)(2,3-dimethyl phenolate)aluminum(III), bis(2-methyl-8-quinolinolato)(2,6-dimethyl phenolate)aluminum (III), bis(2-methyl-8-quinolinolato)(3,4-dimethyl phenolate) aluminum(III), bis(2-methyl-8-quinolinolato)(3,5-dimethyl phenolate)aluminum(III), bis(2-methyl-8-quinolinolato)(3,5-di-tert-butyl phenolate)aluminum(III), bis(2-methyl-8-quinolinolato)(2,6-diphenyl phenolate)aluminum(III), bis(2-methyl-8-quinolinolato)(2,4,6-triphenyl phenolate) aluminum(III), bis(2-methyl-8-quinolinolato)(2,3,6-trimethyl phenolate)aluminum(III), bis(2-methyl-8-quinolinolato)(2,3,5,6-tetramethyl phenolate)aluminum(III), bis(2-methyl-8-quinolinolato)(1-naphtholate)aluminum (III), bis(2-methyl-8-quinolinolato)(2-naphtholate)aluminum(III), bis(2,4-dimethyl-8-quinolinolato)(ortho-phenyl phenolate)aluminum(III), bis(2,4-dimethyl-8-quinolinolato) (para-phenyl phenolate)aluminum(III), bis(2,4-dimethyl-8-quinolinolato)(metha-phenyl phenolate)aluminum(III), bis (2,4-dimethyl-8-quinolinolato)(3,5-dimethyl phenolate) aluminum(III), bis(2,4-dimethyl-8-quinolinolato)(3,5-di-tert-butyl phenolate)aluminum (III), bis(2-methyl-4-ethyl-8-quinolinolato) (para-crezolate)aluminum(III), bis(2-methyl-4-methoxy-8-quinolinolato)(para-phenyl phenolate) aluminum(III), bis(2-methyl-5-cyano-8-quinolinolato) (ortho-crezolate)aluminum(III), and bis(2-methyl-6-trifluoromethyl-8-quinolinolato) (2-naphtholate)aluminum (III).

Further, there can be exemplified bis(2-methyl-8-quinolinolato)aluminum(III)-μ-oxo-bis(2-methyl-8-quinolinolato) aluminum(III), bis(2,4-dimethyl-8-quinolinolato)aluminum (III)-μ-oxo-bis(2,4-dimethyl-8-quinolinolato)aluminum (III), bis(4-ethyl-2-methyl-8-quinolinolato)aluminum(III)-μ-oxo-bis(4-ethyl-2-methyl-8-quinolinolato)aluminum(III), bis(2-methyl-4-methoxy quinolinolato)aluminum(III)-μ-oxo-bis(2-methyl-4-methoxy quinolinolato)aluminum(III), bis(5-cyano-2-methyl-8-quinolinolato)aluminum(III)-μ-oxo-bis(5-cyano-2-methyl-8-quinolinolato)aluminum(III), and bis(2-methyl-5-trifluoromethyl-8-quinolinolato)aluminum(III)-μ-oxo-bis(2-methyl-5-trifluoromethyl-8-quinolinolato)aluminum(III).

Other host materials can be phenyl anthracene derivatives discolored in Japanese Patent Application No. Heisei 6-110569 and tetraaryl ethene derivatives disclosed in Japanese Patent Application No. Heisei 6-114456.

The light emitting layer can function as electron injection and transport layer. In this case, tris(8-quinolinolato)aluminum can be used preferably. These fluorescent materials can be prepared by deposition.

If necessary, the light emitting layer can be constituted of a mixed layer composed of at least one hole injection and transport compound and at least one electron injection and transport compound. This mixed layer is preferred to contain a dopant. The content of the dopant compound is preferably in the range of 0.01 to 20 weight %, more preferably in the range of 0.1 to 15 weight %.

In the mixed layer, since a hopping conduction path of carriers is formed, each carrier moves in the substance having a dominant plurality which is the same as the carrier, and therefore, injection of carriers of the opposite polarity becomes difficult to occur, with the result that the organic compound becomes hard to be damaged, and therefore, the lift time of the element is elongated. Furthermore, If the dopant is included in such a mixed layer, the light emitting wavelength characteristics inherent to the mixed layer can be changed so that the light emitting wavelength can be shifted to a long wavelength, and furthermore, the luminous intensity of the emitted light and the stability of the element can be increased.

The hole injection and transport compound and the electron injection and transport compound included in the mixed layer can be respectively selected from hole injection and transport compounds and electron injection and transport compounds which will be described later.

Among those materials, the hole injection and transport compound is preferred to be selected from an amine derivative having a strong fluorescent property, for example, a triphenylamine derivative, a styrylamine derivative, or an amine derivative having an aromatic fused ring.

The electron injection and transport compound is preferred to be selected from metallic complex such as quinoline derivatives, whose ligand is 8-quinolinol or its derivatives, such as tris(8-quinolinolato)aluminum (Alq3). In addition, it is preferable to use the phenyl anthracene derivatives and the tetraaryl ethene derivatives as mentioned above.

In this case, the mixing ratio is determined by considering a carrier mobility and a carrier density of respective materials. In general, the weight ratio of the hole injection and transport compound to the electron injection and transport compound is 1/99 to 99/1, preferably, 10/90 to 90/10, more preferably 20/80 to 80/20.

The thickness of the mixed layer is preferably from a thickness corresponding to a mono-molecule layer, to a thickness less than the film thickness of the organic compound layer. Specifically, it is preferably in the range of 1 to 85 nm, more preferably in the range of 5 to 60 nm, and further more preferably in the range of 5 to 50 nm.

The mixed layer is preferably formed by a co-vapor deposition which uses evaporation from different evaporation sources. However, if starting materials have vapor pressures (evaporation temperature) substantially equal to each other or very near to each other, the starting materials can be mixed in an evaporation board to be evaporated. In the mixed layer, it is preferred that the respective compounds are uniformly mixed, but, the compounds can exist in the form of islands in some cases. The light emitting layer is generally formed to have a predetermined thickness by depositing the organic fluorescent substance or by coating organic fluorescent substance dispersed in a resin binder.

The hole injection and transport layer can be formed by using various organic compounds disclosed in Japanese Patent Application Pre-examination Publications Nos. JP-A-83-295685, JP-A-02-191684, JP-A-03-000792, JP-A-05-234681, JP-A-05-239455, JP-A-05-299174, JP-A-07-126225, JP-A-07-126226 and JP-A-08-100172 and European Patent Application Pre-examination Publication No. EP-0650955-A1. For example, tetraaryl benzidine compound (tetraaryl diamine or triphenyl diamine (TPD)), aromatic tertiary amine, hydrazones, carbazoles, triazoles, imidazoles, oxadiazoles having an amino group, and polythiophene. In addition, it is possible to use two or more of the above mentioned compounds. In this case, the two or more compounds can be mixed or formed in different layers which are laminated.

In the case of separately forming a hole injection layer and a hole transport layer as the hole injection and transport layer, it is possible to select and use a preferred combination from compounds for the hole transport layer. In this case, it is preferable to stack the compounds in the ascending order of ionization potential counted from the upper electrode (ITO or another). In addition, it is preferable to use a compound having a good thin film property on the surface of the upper electrode. This stacking order can be applied to the case of forming two or more hole transport layers. This stacking order can lower the drive voltage, and can prevent generation of a current leakage and generation and growth of dark spots. In addition, in the case that it is divided into a plurality of elements, since it is formed by vapor deposition, the very thin film on the order of 1 to 10 nm is uniform and free of pin hole, and therefore, even if the hole injection layer is formed of a compound having a small ionization potential and an absorption in a visible range, it is possible to prevent the tone change of the emitted light and the drop of efficiency caused by a re-absorption. The hole injection and transport layer can be formed by vapor deposition of the above mentioned compounds, similarly to formation of the light emitting layer.

The electron injection and transport layer, which is provided as an optional layer, can be formed of organometallic complex such as quinoline derivatives whose ligand is 8-quinolinol or its derivatives, such as tris(8-quinolinolato) aluminum(Alq3), oxadiazoles, perylenes, pyridines, pyrimidines, quinoxalines, diphenyl quinone derivative and nitro-substituted fluorenes. Electron injection transport layer can function also as a light emitting layer. In this case, it is preferred o use tris(8-quinolinolato)aluminum or the like. The electron injection transport layer can be formed by vapor deposition, similarly to the formation of the light emitting layer.

In the case of separately forming an electron injection layer and an electron transport layer as the electron injection and transport layer, it is possible to select and use a preferred combination from compounds for the electron transport layer. In this case, it is preferable to stack the compounds in the descending order of electron affinity counted from the cathode. This stacking order can be applied to the case of forming two or more electron transport layers. Furthermore, as mentioned in "Organic EL elements and the forefront of their industrialization", published from NTS Publication, Pages 48-49, 69-70 and 86-89, materials which include, as a light emitting polymeric material, a precursor of conjugated organic polymer and at least one fluorescent substance. The precursor can be, for example, PPV(polyparaphenylene vinylene), polyparaphenylene vinylene derivatives such as Ro-PPV, CN-PPV, MEH-PPV, DMOS-PPV, polythiophene derivatives such as PAT, PCHMT, POPT, PTOPT, PDCHT, PCHT, POPT, PPP(polyparaphenylene), polyparaphenylene derivative such as RO-PPP, FP-PPP, PDAF, polysilanes derivative such as PMPS, PPS, PMrPrS, PNPS, PBPS, polyacetylene derivatives such as PAPA, PDPA, and other derivatives including PdPhQx, PQx, PVK, PPD and so on. The precursor can be added with colorant such as perylene, Qd-1, Coumarine 6, Qd-3, Qd-2, DCM1, BCzVBi, Rubrene, TPP, DCM2, Coumarin 540, Rhodamine 6G, Quinacridone, Sq, Pyazoline, Decacyclene, Phenoxazone and Eu.

The material of the substrate is not limited, but can be suitably determined in view of the property of the conducting layer deposited thereon, and other factors. For example, a metallic material such as aluminum or a transparent, semitransparent or opaque material such as a glass, quartz, resin. In this case, in addition to the class, it is possible to use a ceramics such as alumina, a metal sheet such as a stainless steel sheet processed to have an insulating surface by means of a surface oxidation, a thermosetting resin such as phenol, or a thermoplastic resin such as polycarbonate.

The organic EL light emitting element in accordance with the present invention is ordinarily used as a DC-driven EL element, but can be used by an AC driving or a pulse driving. The applied voltage is ordinarily on the order of 5 to 20V.

In a low molecular system, the anode buffer layer can be usually formed of star berth such as copper phthalocyanine (CuPc) and m-MTDATA and high polymer arylamine called as amine. It is also possible to use a layer in which Lewis acid is added to triphenylamines to produce radical cation to improve conductivity. In a high polymer system, it is possible to use conducting polymer such as polyaniline (PAni) and polythiophene (PEDOT). The anode buffer layer can be formed by vapor deposition of the above-mentioned compound, similarly to the formation of the light emitting layer.

The switching elements and the current applying elements can be formed of a transistor or a transistor-based device.

The switching lines, the current supplying lines, the second switching lines, the common lines and the ground lines can be formed of Al, Cu, Ta, Ru, WSi, or others, which can be deposited by the sputtering, the vapor-deposition, or the CVD process.

A transparent member in the form of a convex lens can be formed of a transparent material such as a resin typified an acrylic resin or $SiO_2$.

The source electrode, the drain electrode and the gate electrode of the switching transistors and the current applying transistors can be formed of Al, Cu, Ta, Ru, WSi, or others, which can be deposited by the sputtering, the vapor-deposition, or the CVD process.

The gate insulating film, the first interlayer insulating film, the second interlayer insulating film and the barrier layer can be formed of aluminum oxide, silicon oxide, silicon nitride or their mixture.

The light sensor has for example the following structure sandwiched between the upper electrode and the lower electrode:

a pn junction formed by a p-type semiconductor/n-type semiconductor;

a pn junction formed by an n-type semiconductor/p-type semiconductor; a stacked structure formed of a p-type semiconductor/intrinsic semiconductor/n-type semiconductor; and a stacked structure formed of an n-type semiconductor/intrinsic semiconductor/p-type semiconductor; and The n-type semiconductor, the intrinsic semiconductor and the p-type semiconductor are not limited, and therefore can be formed of known materials by use of a known forming process.

The light emitting device having the composition and the structure shown in FIGS. 1, 11 and 12 were actually experimentally formed. The size of one unitary element was of 40 μm×40 μm, and the whole size of the display portion was of 40 mm×40 mm.

In experimentally forming the elements, the substrate was formed of a non-alkali glass, and the lower electrode layer was formed of AlLi. The hole injection layer was formed of α-NPD, and the light emitting layer functioning as the electron injection and transport layer was formed of Alq3. The anode buffer layer was formed of polyaniline, and the upper electrode was formed of a mixture of indium (In) oxide and tin (Sn). The first switching lines, the second switching lines and the ground lines was formed of aluminum.

The switching elements and the current applying elements were formed of transistors. The source/drain electrodes of the transistors were formed of aluminum, and the gate electrode of the transistors was formed of WSi. The gate insulating film, the first interlayer insulating film, the second interlayer insulating film and the barrier layer were formed of silicon oxide.

The lower electrode of the light sensor was formed of ITO, and the n-type semiconductor was formed of phosphorus-doped silicon. The p-type semiconductor was formed of boron-doped silicon, and the upper electrode was formed of aluminum.

The luminance of the element was measured by the light sensor internally provided for each element, and the light emitting time of each element was adjusted in accordance with the measurement data, so as to carry out the luminance correction (correction in viewing impression).

For comparison, the same light emitting device which does not carry out the luminance correction, were prepared.

An accelerated test (temperature is 80 degrees Celsius and moisture is 90%) was carried out by applying a voltage of 5V to the anode of the upper electrode of the two kinds of the light emitting device thus prepared, and also by applying the voltage of 5V to all the switching lines (date lines) and the second switching lines (data lines), all the elements are energized to emit the light. The viewing impression of the display devices was compared.

After 100 hours of the accelerated test, the light emitting display device configured to carry out the luminance correction and the light emitting display device which does not carry out the luminance correction, are compared by visual inspection. An unevenness of luminance and an unevenness of color remarkably occurred in the device which does not carry out the luminance correction. On the other hand, in the device configured to carry out the luminance correction, the unevenness of luminance and the unevenness of color are negligible. Namely, since the light sensor is provided on the light emitting element and since the drop of the luminance of the element is compensated for on the basis of the measured value of the luminance of each element, it is possible to minimize the unevenness of luminance and the unevenness of color.

According to the present invention, it is possible to provide the light emitting device so configured to sufficiently prevent the unevenness of luminance and the deterioration in color balance, and to efficiently guide the light emitted from the light emitting element to the light sensor, so as to enable to detect the luminous intensity of the emitted light with high sensitiveness, with a minimized adverse mutual influence between the light emitting element and the light sensor, and a light emitting system utilizing the light emitting device.

The invention claimed is:

1. A light emitting system comprising:
    a light emitting device including a light emitting element and a light sensor for detecting the luminous intensity of the light emitted from the light emitting element, said light emitting element including a lower electrode, a light emitting material layer including at least a light emitting layer, and an upper electrode having light transparency, which are formed on a substrate in the named order, one of said lower electrode and said upper electrode acting as a cathode, and the other acting as an anode, said light sensor being formed directly on said upper electrode of said light emitting element, said light sensor included in said light emitting device outputting the detection result of the luminous intensity as a current signal,
    a light sensor switching element for switching whether or not a biasing voltage is applied which enables to generate the current signal in proportion to the amount of the light received, said light sensor switching element being provided in the way of a bias voltage supplying line for said light sensor,
    a light sensor switching unit for controlling a switching operation of said light sensor switching element, said light sensor switching element being connected to said light sensor switching unit through a light sensor switching line.

2. The light emitting system claimed in claim 1 including a plurality of light emitting devices, wherein said light sensor switching line is located in the form of a matrix having rows and columns, wherein each light sensor switching element is connected to one light sensor switching line of a column direction and to one light sensor switching line of a row direction wherein said light sensor switching lines of the column direction and the row direction are connected to said light sensor switching unit, which applies a voltage to a selected column direction light sensor switching line and a selected row direction light sensor switching line so that the biasing voltage is applied to the specific light sensor connected to the light sensor switching element connected to said selected column direction light sensor switching line and said selected row direction light sensor switching line, whereby the current signal generated by said specific light sensor is detected.

3. The light emitting system claimed in claim 1 further including a luminous intensity detecting unit connected to said light sensor for detecting, as luminous intensity information of the light emitted from said light emitting element, the current signal generated in response to a reception by said light sensor, of a portion of the light emitted from said light emitting element, or a voltage signal generated from said current signal.

4. The light emitting system claimed in claim 1 further including a current applying element connected to said light emitting element, for supplying said light emitting element with an electric current used in order to cause said light emitting element to emit the light.

5. The light emitting system claimed in claim 4, wherein said current applying element is constituted of a thin film transistor having a gate, a drain and a source, and wherein the electric current is supplied to said light emitting element by connecting said lower electrode or said upper electrode of said light emitting element to said drain or said source of said thin film transistor.

6. The light emitting system claimed in claim 4, further including a current application switching element for switching whether or not the electric current is supplied from said current applying element to said light emitting element.

7. The light emitting system claimed in claim 6, wherein said current application switching element includes at least one FET transistor, and wherein said current applying element is constituted of a thin film transistor having a gate, a drain and a source, the drain of said FET transistor included in said current application switching element being connected to the gate of said transistor included in said current applying element, so that the application of the electric current by said current applying element is switched by an ON-OFF operation of said FET transistor included in said current application switching element.

8. The light emitting system claimed in claim 4, further including a light emission amount adjusting unit for obtaining an optimum value of the electric current supplied to said light emitting element on the basis of said luminous intensity information of the light emitted from said light emitting element and detected by said luminous intensity detecting unit, said light emission amount adjusting unit adjusting the electric current supplied from said current applying element to said light emitting element, to said optimum value of the electric current.

9. The light emitting system claimed in claim 6, including a plurality of light emitting devices, and a current application switching unit for controlling the switching operation of said current application switching element which switches whether or not the electric current is supplied from said current applying element to said light emitting element.

wherein said switching line is located in the form of a matrix having rows and columns, wherein each current application switching element is connected to one light sensor switching line of a column direction and to one light sensor switching line of a row direction wherein said light sensor switching lines of the column direction and the row direction are connected to said current application switching unit, which applies a voltage to a selected column direction switching line and a selected row direction switching line so that an electric current is supplied from a specific current applying element connected to a specific current application switching element connected to said selected column direction switching line and said selected row direction switching line, whereby the current is supplied to said specific light emitting element connected to said specific current applying element.

10. The light emitting system claimed in claim 9, including a light emission time adjusting unit for obtaining an optimum time of the electric current supplied to said light emitting element on the basis of said luminous intensity information of the light emitted from said light emitting element and detected by said luminous intensity detecting unit, said light emission time adjusting unit controlling the switching operation of said current application switching element by said current application switching unit, whereby adjusting the time of the electric current supplied from said current applying element to said light emitting element, to said optimum time of the electric current.

11. The light emitting system claimed in claim 1, wherein said light sensor includes a pn junction formed by a region formed of a p-type semiconductor and another region formed of an n-type semiconductor, or a pin structure formed by a region formed of a p-type semiconductor, another region formed of an n-type semiconductor, and an intrinsic semiconductor sandwiched between those two regions.

wherein said light sensor switching element includes at least one FET transistor a drain of the one FET transistor included in said light sensor switching element being connected to said n-type semiconductor of said light sensor, said light sensor switching element is switched by an ON-OFF operation of said FET transistor having the drain connected to said n-type semiconductor of said light sensor.

12. The light emitting system claimed in claim 11, wherein said FET transistor having the drain connected to said n-type semiconductor of said light sensor has a source connected to said luminous intensity detecting unit through a light sensor current detecting line, so that the current signal generated in response to a reception by said light sensor, of a portion of the light emitted from said light emitting element, flows as a source-drain current of said FET transistor having the drain connected to said n-type semiconductor of said light sensor, and is transmitted to said luminous intensity detecting unit through said light sensor current detecting line.

* * * * *

UNITED STATES PATENT AND TRADEMARK OFFICE
CERTIFICATE OF CORRECTION

PATENT NO. : 7,623,101 B2  Page 1 of 1
APPLICATION NO. : 11/279479
DATED : November 24, 2009
INVENTOR(S) : Hayashi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 709 days.

Signed and Sealed this

Twenty-sixth Day of October, 2010

David J. Kappos
*Director of the United States Patent and Trademark Office*